United States Patent
Collins et al.

(10) Patent No.: US 6,514,376 B1
(45) Date of Patent: *Feb. 4, 2003

(54) THERMAL CONTROL APPARATUS FOR INDUCTIVELY COUPLED RF PLASMA REACTOR HAVING AN OVERHEAD SOLENOIDAL ANTENNA

(75) Inventors: Kenneth Collins, San Jose, CA (US); Michael Rice, Pleasanton, CA (US); Eric Askarinam, Sunnyvale, CA (US); Douglas Buchberger, Tracy, CA (US); Craig Roderick, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/520,623

(22) Filed: Mar. 7, 2000

Related U.S. Application Data

(63) Continuation-in-part of application No. 08/648,254, filed on May 13, 1996, now Pat. No. 6,165,311, which is a continuation-in-part of application No. 08/580,026, filed on Dec. 20, 1995, which is a continuation of application No. 08/041,796, filed on Apr. 1, 1993, now Pat. No. 5,556,501, which is a continuation of application No. 07/722,340, filed on Jun. 27, 1991, now abandoned, and a continuation-in-part of application No. 08/503,467, filed on Jul. 18, 1995, now Pat. No. 5,770,099, which is a division of application No. 08/138,060, filed on Oct. 15, 1993, now Pat. No. 5,477,975, and a continuation-in-part of application No. 08/597,577, filed on Feb. 2, 1996, now Pat. No. 6,077,384, which is a continuation-in-part of application No. 08/521,668, filed on Aug. 31, 1995, now abandoned, which is a continuation-in-part of application No. 08/289,336, filed on Aug. 11, 1994, now abandoned, which is a continuation of application No. 07/984,045, filed on Dec. 1, 1992, now abandoned.

(51) Int. Cl.$^7$ .......................... C23C 16/00; C23C 14/32; H01L 21/306

(52) U.S. Cl. ................... 156/345.37; 156/345; 156/48; 156/345.53; 204/298.09; 204/298.31; 118/723 I; 118/723 IR; 118/723 AN; 118/724; 118/728

(58) Field of Search .................. 156/345, 345.37, 156/345.48, 345.53; 118/723 E, 723 I, 723 IR, 723 AN, 724, 728; 204/298.06, 298.07, 298.09, 298.31, 298.33, 298.34, 298.37

(56) References Cited

U.S. PATENT DOCUMENTS 4,123,316 A    10/1978    Tsuchimoto ................ 438/731

(List continued on next page.)

FOREIGN PATENT DOCUMENTS

DE    39 42964 A1    6/1991

(List continued on next page.)

OTHER PUBLICATIONS

Coburn, W.J., "Increasing the Etch Rate Ratio oSiO2/Si in Fluorocarbon Plasma Etching," *IBM Technical Disclosure*, vol. 19, No. 10, Mar. 1977.

(List continued on next page.)

Primary Examiner—Rodney G. McDonald
(74) Attorney, Agent, or Firm—Robert M. Wallace; Joseph Bach

(57) ABSTRACT

The invention is embodied in a plasma reactor including a plasma reactor chamber and a workpiece support for holding a workpiece near a support plane inside the chamber during processing, the chamber having a reactor enclosure portion facing the support, a cold body overlying the reactor enclosure portion, a plasma source power applicator between the reactor enclosure portion and the cold body and a thermally conductor between and in contact with the cold body and the reactor enclosure. The thermal conductor and the cold sink define a cold sink interface therebetween, the reactor preferably further including a thermally conductive substance within the cold sink interface for reducing the thermal resistance across the cold sink interface. The thermally conductive substance can be a thermally conductive gas filling the cold body interface. Alternatively, the thermally conductive substance can be a thermally conductive solid material. The reactor can include a gas manifold in the cold body communicable with a source of the thermally conductive gas an inlet through the cold body from the gas manifold and opening out to the cold body interface. The reactor can further include an O-ring apparatus sandwiched between the cold body and the thermal conductor and defining a gas-containing volume in the cold body interface of nearly infinitesimal thickness in communication with the inlet from the cold body. More generally, the reactor can include the facilitation of thermal transfer across an interface between a hot and/or cold sink and any part exposed to the reactor chamber interior atmosphere, such as the ceiling, wall or polymer-hardening precursor ring, for example, by the insertion into that interface of a thermally conductive gas or substance.

50 Claims, 26 Drawing Sheets

U.S. PATENT DOCUMENTS

| | | | |
|---|---|---|---|
| 4,261,762 A | 4/1981 | King | 438/514 |
| 4,350,578 A | 9/1982 | Frieser et al. | 204/192.35 |
| 4,371,412 A | 2/1983 | Nishizawa | 156/345 |
| 4,427,516 A | 1/1984 | Levinstein et al. | 204/192.38 |
| 4,427,762 A | 1/1984 | Takahashi et al. | 430/436 |
| 4,430,547 A | 2/1984 | Yoneda et al. | 219/121.4 |
| 4,457,359 A | 7/1984 | Holden | 165/80.5 |
| 4,512,391 A | 4/1985 | Harra | 165/48.1 |
| 4,565,601 A | 1/1986 | Kakehi et al. | 216/59 |
| 4,579,080 A | 4/1986 | Martin et al. | 118/500 |
| 4,711,698 A | 12/1987 | Douglas | 438/722 |
| 4,755,345 A | 7/1988 | Baity, Jr. et al. | 376/123 |
| 4,756,810 A | 7/1988 | Lamont, Jr. et al. | 204/192.3 |
| 4,786,352 A | 11/1988 | Benzing | 156/345 |
| 4,786,359 A | 11/1988 | Stark et al. | 438/710 |
| 4,793,897 A | 12/1988 | Dunfield et al. | 438/724 |
| 4,807,016 A | 2/1989 | Douglas | 257/774 |
| 4,810,935 A | 3/1989 | Boswell | 315/111.91 |
| 4,842,683 A | 6/1989 | Cheng et al. | 156/345 |
| 4,870,245 A | 9/1989 | Price et al. | 219/121.36 |
| 4,918,031 A | 4/1990 | Flamm et al. | 438/695 |
| 4,948,458 A | 8/1990 | Ogle | 438/729 |
| 4,948,750 A | 8/1990 | Kausche et al. | 438/495 |
| 4,990,229 A | 2/1991 | Campbell et al. | 204/298.06 |
| 5,000,113 A | 3/1991 | Wang et al. | 118/723 E |
| 5,006,220 A | 4/1991 | Hijikata et al. | 207/298.33 |
| 5,015,330 A | 5/1991 | Okumura et al. | 438/694 |
| 5,074,456 A | 12/1991 | Degner et al. | 228/121 |
| 5,085,727 A | 2/1992 | Steger | 156/345 |
| 5,169,487 A | 12/1992 | Langley et al. | 438/714 |
| 5,173,412 A | 12/1992 | Kiener et al. | 435/122 |
| 5,187,454 A | 2/1993 | Collins et al. | 333/17.3 |
| 5,203,956 A | 4/1993 | Hansen | 216/63 |
| 5,241,245 A | 8/1993 | Barnes et al. | 315/111.41 |
| 5,249,251 A | 9/1993 | Egalon et al. | 385/123 |
| 5,258,824 A | 11/1993 | Carlson et al. | 356/382 |
| 5,276,693 A | 1/1994 | Long et al. | 372/6 |
| 5,277,751 A | 1/1994 | Ogle | 216/70 |
| 5,326,404 A | 7/1994 | Sato | 118/723 MR |
| 5,346,578 A | 9/1994 | Benzing et al. | 156/345 |
| 5,349,313 A | 9/1994 | Collins et al. | 333/131 |
| 5,392,018 A | 2/1995 | Collins et al. | 336/155 |
| 5,399,237 A | 3/1995 | Keswick et al. | 216/68 |
| 5,401,350 A | 3/1995 | Patrick et al. | 156/345 |
| 5,414,246 A | 5/1995 | Shapona | 219/640 |
| 5,421,891 A | 6/1995 | Campbell et al. | 118/723 R |
| 5,423,945 A | 6/1995 | Marks et al. | 438/695 |
| 5,468,341 A | 11/1995 | Samukawa | 216/69 |
| 5,477,975 A | 12/1995 | Rice et al. | 216/68 |
| 5,514,246 A | 5/1996 | Blalock | 438/694 |
| 5,529,657 A | 6/1996 | Ishii | 156/345 |
| 5,556,501 A | 9/1996 | Collins et al. | 156/345 |
| 5,607,542 A | 3/1997 | Wu et al. | 438/707 |
| 6,063,233 A * | 5/2000 | Collins et al. | 156/345 |
| 6,074,512 A * | 6/2000 | Collins et al. | 156/345 |
| 6,095,083 A * | 8/2000 | Rice et al. | 118/723 I |

FOREIGN PATENT DOCUMENTS

| | | |
|---|---|---|
| EP | 0 403 418 A2 | 12/1990 |
| EP | 0 413 282 A2 | 2/1991 |
| EP | 0 520 519 A1 | 12/1992 |
| EP | 0 522 490 A1 | 7/1993 |
| EP | 0 522 941 A1 | 7/1993 |
| EP | 0 596 551 A1 | 5/1994 |
| EP | 0 601 468 A1 | 6/1994 |
| EP | 0 641 013 A2 | 3/1995 |
| EP | 0 651 434 A2 | 5/1995 |
| EP | 0 680 072 A2 | 11/1995 |
| EP | 0 702 391 A2 | 3/1996 |
| EP | 0 710 055 A1 | 5/1996 |
| EP | 0 727 807 A1 | 8/1996 |
| EP | 0 727 923 A1 | 8/1996 |
| EP | 0 742 577 A2 | 11/1996 |
| EP | 0 756 309 A1 | 1/1997 |
| EP | 0 807 952 A2 | 11/1997 |
| GB | 231197 | 8/1925 |
| JP | 55-154582 | 12/1980 |
| JP | 57-155732 | 9/1982 |
| JP | 61-147531 | 12/1984 |
| JP | 61-91377 | 5/1986 |
| JP | 61-142744 | 6/1986 |
| JP | 62-254428 | 11/1987 |
| JP | 63-9120 | 1/1988 |
| WO | WO 91/10341 | 7/1991 |
| WO | WO 92/20833 | 11/1992 |
| WO | WO 97/08734 | 3/1997 |

OTHER PUBLICATIONS

Matsuo, Seitaro, "Selective Etching of SiO2 Relative to Si Plasma Reactive Sputter Etching," *J. Vac. Sc. Technology*, vol. 17, No. 2, Mar.–Apr. 1980.

Lee, Ho–Jun, Yang, Dong–II and Whang, Ki–Woong, "The effects of magnetic fields on a planar inductively coupled argon plasma," *Plasma Sources Sci. Technol.*, 5(1996), pp. 383–388.

Sugai, H. and Nakamura, K., "Diagnostics and Control of radicals in an inductively coupled etching reactor," *J. Vac. Sci. Technol.*, A 13(3), May/Jun. 1995, pp. 887–893.

Horiike, Yashuiro, Kazuhiro, Shindo, Haruo and Kukasawa, Takayuki, "High rate and highly selective SiO2 etching employing inductively coupled plasma and discussion on reaction kinetics," *J. Vac. Sci. Technol.*, A 13(3), May/Jun. 1995, pp. 801–809.

Lieberman, M.A. and Ashida, S., "Global models of pulse–power–modulated high–density, low pressure discharges," *Plasma Sources Sci. Technol.*, 5(1996), pp. 145–158.

Samukawa, Seiji and Ohtake, Hiroto, "Pulse–time Modulated Plasma Etching for Precise ULSI Patterning," Abstract No. 162, *Microelectronics Research Laboratories*, NEC Corporation, Japan, May 1996, pp. 217–218.

Shibano, Teruo, Fujiwara, Nobuo, Hirayama, Makoto, Nagata, Hitoshi and Demizo, Kiyoshi, "Etching yields of SiO2 by low energy CF+x and Fx ions," *Appl. Phys. Lett.*, vol. 63, No. 17, Oct. 25, 1993.

Tynan, G.R., Bailey, A.D., III, Campbell, G.A., Charatan, R., de Chambrier, A., Gibson, G., "Characterization of an Azimuthally Symmetric helicon Wave High Density Plasma Source," *Trikon Technologies, Inc.*, Japan, Jul. 1997.

European Patent Office Communication Pursuant to Article 96(2) and Rule 51(2) EPC for Application No. 94307307.2–2208, mailed Jan., 1996.

Patent Abstracts of Japan, Publication No. 57045927 A, Mar. 16, 1982 (Fujitsu Ltd).

Patent Abstracts of Japan, Publication No. 06196446 A, Jul. 15, 1994 (NEC Corp).

Patent Abstracts of Japan, Publication No. 07288196 A, Oct. 31, 1995 (Tokyo Electron Ltd).

Patent Abstracts of Japan, Publication No. 08017799 A, Jan. 19, 1996 (Plasma Syst:KK).

Patent Abstracts of Japan, Publication No. 62052714 A, Mar. 7, 1987 (Olympus Optical Co. Ltd; Toagosei Chem Ind Co Ltd).

* cited by examiner

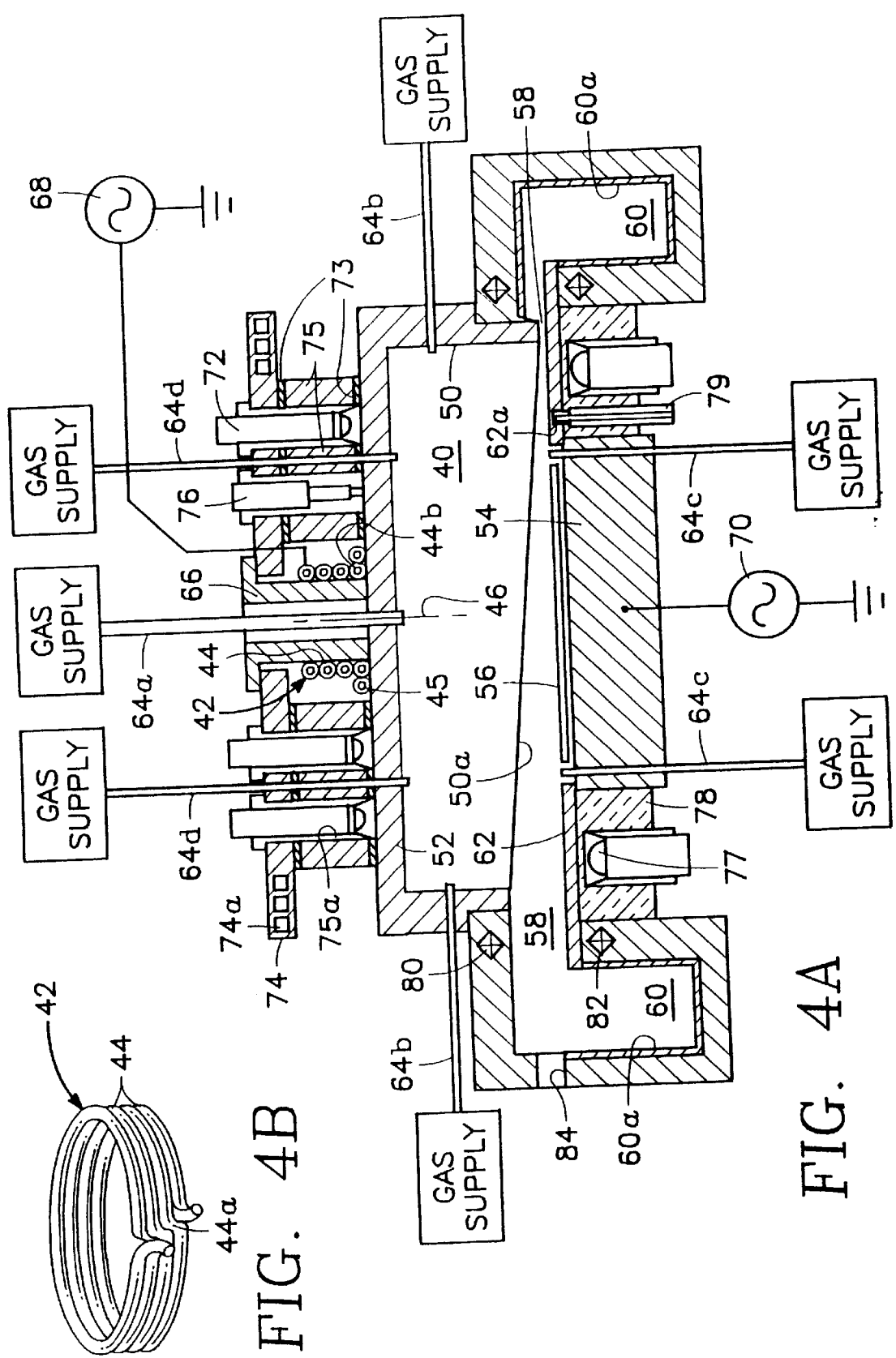

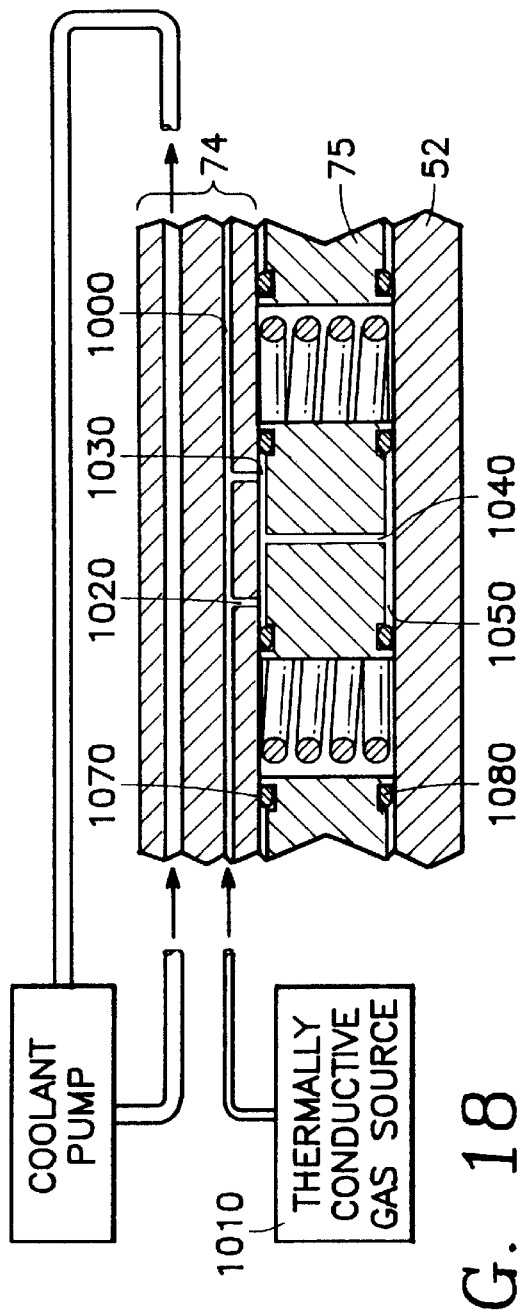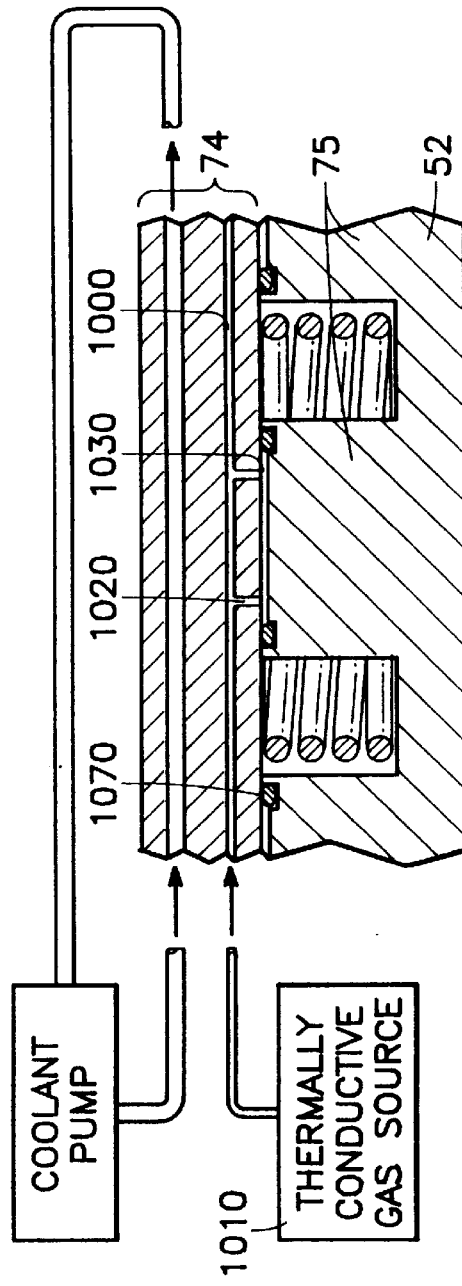

THERMAL CONTROL APPARATUS FOR INDUCTIVELY COUPLED RF PLASMA REACTOR HAVING AN OVERHEAD SOLENOIDAL ANTENNA

RELATED APPLICATIONS

This application is a continuation-in-part of U.S. patent application Ser. No. 08/648,254 Filed May 13, 1996 by Kenneth S. Collins et al entitled "INDUCTIVELY COUPLED RF PLASMA REACTOR HAVING AN OVERHEAD SOLENOIDAL ANTENNA" now U.S. Pat. No. 6,165,311, which is a continuation-in-part of application Ser. No. 08/580,026 filed Dec. 20, 1995 by Kenneth S. Collins et al. now pending which is a continuation of Ser. No. 08/041, 796 filed Apr. 1, 1993 now U.S. Pat. No. 5,556,501 which is a continuation of Ser. No. 07/722,340 filed Jun. 27, 1991 now abandoned and a continuation-in-part of Ser. No. 08/503,467 filed Jul. 18, 1995 by Michael Rice et al. now U.S. Pat. No. 5,770,099 which is a divisional of Ser. No. 08/138,060 filed Oct. 15, 1993 now U.S. Pat. No. 5,477,975; and a continuation-in-part of Ser. No. 08/597,577 filed Feb. 2, 1996 by Kenneth Collins now U.S. Pat. No. 6,077,384, which is a continuation-in-part of Ser. No. 08/521,668 filed Aug. 31, 1995 (now abandoned), which is a continuation-in-part of Ser. No. 08/289,336 filed Aug. 11, 1994 now abandoned, which is a continuation of Ser. No. 07/984,045 filed Dec. 1, 1992 (now abandoned). In addition, U.S. application Ser. No. 08/648,256 filed May 13, 1996 now U.S. Pat. No. 6,036,877 by Kenneth S. Collins et al. entitled "Plasma With Heated Source of a Polymer-Hardening Precursor Material" discloses related subject matter.

BACKGROUND OF THE INVENTION

1. Technical Field

The invention is related to heating and cooling apparatus in an inductively coupled RF plasma reactors of the type having a reactor chamber ceiling overlying a workpiece being processed and an inductive coil antenna adjacent the ceiling.

2. Background Art

In a plasma processing chamber, and especially in a high density plasma processing chamber, RF (radio frequency) power is used to generate and maintain a plasma within the processing chamber. As disclosed in detail in the above-referenced applications, it is often necessary to control temperatures of surfaces within the process chamber, independent of time varying heat loads imposed by processing conditions, or of other time varying boundary conditions. In some cases where the window/electrode is a semiconducting material, it may be necessary to control the temperature of the window/electrode within a temperature range to obtain the proper electrical properties of the window. Namely, for the window/electrode to function simultaneously as a window and as an electrode, the electrical resistivity is a function of temperature for semiconductors, and the temperature of the window/electrode is best operated within a range of temperatures. The application of RF power to generate and maintain the plasma leads to heating of surfaces within the chamber, including windows (such as used for inductive or electromagnetic coupling of RF or microwave power) or electrodes (such as used for capacitive or electrostatic coupling of RF power, or for terminating or providing a ground or return path for such capacitive or electrostatic coupling of RF power) or for combination window/electrodes. Heating of those surfaces can occur due to 1) ion or electron bombardment, 2) absorption of light emitted from excited species, 3) absorption of power directly from the electromagnetic or electrostatic field, 4) radiation from other surfaces within the chamber, 5) conduction (typically small effect at low neutral gas pressure), 6) convection (typically small effect at low mass flow rates), 7) chemical reaction (i.e. at the surface of the window or electrode due to reaction with active species in plasma).

Depending on the process being performed with the plasma process chamber, it may be necessary to heat the window or electrode to a temperature above that temperature which the window or electrode would reach due to internal sources of heat as described above, or it may be necessary to cool the window or electrode to a temperature below that temperature which the window or electrode would reach due to internal sources of heat during some other portion of the operating process or sequence of processes. In such cases, a method for coupling heat into the window or electrode and a method for coupling heat out of the window or electrode is required.

Approaches for heating window/electrodes from outside the process chamber include the following:

1. heating the window/electrode by an external source of radiation (i.e., a lamp or radiant heater, or an inductive heat source),
2. heating the window/electrode by an external source of convection (i.e. forced fluid, heated by radiation, conduction, or convection),
3. heating the window/electrode by an external source of conduction (i.e., a resistive heater).

The foregoing heating methods, without any means for cooling, limit the temperature range available for window or electrode operation to temperatures greater than the temperature which the window or electrode would reach due to internal sources of heat alone.

Approaches for cooling window/electrodes from outside the process chamber include the following:

1. cooling the window/electrode by radiation to a colder external surface,
2. cooling the window/electrode by an external source of convection (i.e., natural or forced),
3. cooling the window/electrode by conduction to an external heat sink.

The foregoing cooling methods, without any means for heating other than internal heat sources, limit the temperature range available for window or electrode operation to temperatures less than that temperature which the window or electrode would reach due to internal sources of heat alone.

Additionally the foregoing cooling methods have the following problems:

1. cooling the window/electrode by radiation is limited to low heat transfer rates (which in many cases are insufficient for the window or electrode temperature range required and the rate of internal heating of window or electrodes) at low temperatures due to the $T^4$ dependence of radiation power, where T is the absolute (Kelvin) temperature of the surface radiating or absorbing heat;
2. cooling the window/electrode by an external source of convection can provide large heat transfer rates by using a liquid with high thermal conductivity, and high product of density & specific heat when high flow rates are used, but liquid convection cooling has the following problems:
   A) it is limited to maximum temperature of operation by vapor pressure dependence of liquid on temperature (i.e. boiling point) (unless a phase change is allowed, which has its own problems—i.e. fixed temperature of phase change—no control range, as well safety issues), B) incompatibility of liquid cooling with the electrical environment, depending upon liquid electrical properties, C) general integration issues with liquid in contact with reactor structural elements. Cooling the window or electrode by an external source of convection (e.g., a cooling gas) is limited to low heat transfer rates which in many cases are insufficient for the window or electrode temperature range required and the rate of internal heating of window or electrodes;

3. cooling the window/electrode by conduction to an external heat sink can provide high rates of heat transfer if the contact resistance between the window or electrode and the heat sink is sufficiently low, but low contact resistance is difficult to attain in practice.

Approaches for both heating and cooling window/electrodes from outside the process chamber include heating the window/electrode by an external source of conduction (i.e., a resistive heater) in combination with cooling the window/electrode by conduction to an external heat sink. In one implementation, the structure is as follows: a window or electrode has a heater plate (a plate with an embedded resistive heater) adjacent an outer surface of the window electrode. Additionally, a heat sink (typically liquid cooled) is placed proximate the opposite side of the heater plate from the window or electrode. Contact resistances are present between window or electrode and heater plate, and between the heater plate and the heat sink. In such a system integrated with automatic control of window or electrode temperature, a temperature measurement is made (continuously or periodically) of the window or electrode to be controlled, the temperature measurement is compared with a set point temperature, and based on the difference between the measured and set point temperatures a controller determines through a control algorithm how much power to apply to the resistive heater, or alternatively, how much cooling to apply to the heat sink, and the controller commands output transducers to output the determined heating or cooling levels. The process is repeated (continuously or periodically) until some desired degree of convergence of the window or electrode temperature to the set point temperature has occurs, and the control system remains active ready to respond to changes in requirements of heating or cooling levels due to changes in internal heat or cooling levels or to changes in the set point temperature. Besides contact resistance problems that limit the cooling capability of the system to control the temperature of the window or electrode, the system exhibits a time lag in transferring heat from the window or electrode to the head sink as required when the internal heating or cooling load changes during plasma reactor operation. This is due in part to the contact resistance between the window or electrode and the heater, and contact resistance between the heater and the heat sink, as well as the thermal capacitance of the heater and the window or electrode. For example, as the internal heat load is increased in a process or sequence of processes, the system senses the increase by measuring an increase in window or electrode temperature. As described above, the system reduces the heater power or increases the cooling power in response to the increase in window or electrode temperature, but there is a lag time for the heat to diffuse through the window or electrode, across the contact resistance between window and heater, and through the heater plate, across the contact resistance between the heater and heat sink. In addition, "excess" heat energy "stored" in the heater diffuses across the contact resistance between the heater and heat sink. This lag causes more difficulty in controlling the temperature of the window or electrode as the internal heat or cooling load changes, typically resulting in some oscillation of the window or electrode temperature about the set point.

A further problem for a window or window/electrode (of the type that allows electromagnetic or inductive RF or microwave power to be coupled from outside the chamber to inside the chamber via the window or window/electrode) is that the presence of heat transfer apparatus (heater and/or heat sinks) interferes with the coupling of such electromagnetic or inductive RF or microwave power, and/or the presence of RF or microwave power coupling apparatus may interfere with heat transfer between heater and/or heat sink and window or window/electrode.

Thus a method is sought for heating and/or cooling a window or electrode or window electrode used in a plasma processing chamber so that the temperature of the window or electrode or window/electrode may be controlled sufficiently close to a set point such that a desired process or sequence of processes may be carried out within the plasma process chamber, independent of the change of internal heating or cooling loads within the chamber or changes in other boundary conditions.

Additionally, a method is sought for heating and/or cooling a window or window/electrode used in a plasma processing chamber so that the temperature of the window or electrode or window/electrode may be controlled sufficiently close to a set point temperature, without interference to coupling of electromagnetic or inductive RF or microwave power through the window or window/electrode such that a desired process or sequence of processes may be carried out within the plasma process chamber, independent of the change of internal heating or cooling loads within the chamber or changes in other boundary conditions.

Additionally, a method is sought for heating and/or cooling an electrode or window/electrode used in a plasma processing chamber so that the temperature of the electrode or window/electrode may be controlled sufficiently close to a set point temperature, without interfering with capacitive or electrostatic coupling of RF power, or interfering with terminating or providing a ground or return path for such capacitive or electrostatic coupling of RF power, such that a desired process or sequence of processes may be carried out within the plasma process chamber, independent of the change of internal heating or cooling loads within the chamber or changes in other boundary conditions.

Additionally, a method is sought for heating and/or cooling a window or electrode or window/electrode used in a plasma processing chamber so that the temperature of the electrode or window/electrode may be controlled sufficiently close to a set point temperature, without interfering with capacitive or electrostatic coupling of RF power, or interfering with terminating or providing a ground or return path for such capacitive or electrostatic coupling RF power, and without interfering with coupling of electromagnetic or inductive RF or microwave power through the window or window/electrode such that a desired process or sequence of processes may be carried out within the plasma process chamber, independent of the change of internal heating or cooling loads within the chamber or changes in other boundary conditions.

SUMMARY OF THE INVENTION

The invention is embodied in a plasma reactor including a plasma reactor chamber and a workpiece support for holding a workpiece near a support plane inside the chamber during processing, the chamber having a reactor enclosure portion facing the support, a cold plate overlying the reactor enclosure portion, a plasma source power applicator between the reactor enclosure portion and the cold plate and a thermally conductor between and in contact with the cold plate and the reactor enclosure. Preferably, the power applicator includes plural radially dispersed applicator elements defining voids therebetween and the thermal conductor includes radially dispersed thermally conductive elements in the voids and contacting the cold sink and the reactor enclosure portion. The radially dispersed thermally conductive elements preferably include respective concentric cylindrical rings. The reactor enclosure portion includes a ceiling, the ceiling including a window for power emanating from the plasma source power applicator. The power applicator preferably includes an inductive antenna in communication with an RF. power generator and the ceiling is inductive power window. The ceiling preferably but not necessarily includes a semiconductor window electrode. The thermal conductor and the cold sink define a cold sink interface therebetween, the reactor preferably further includes a thermally conductive substance within the cold sink interface for reducing the thermal resistance across the cold sink interface. The thermally conductive substance can be a thermally conductive gas filling the cold plate interface. Alternatively, the thermally conductive substance can be a thermally conductive solid material. The reactor can include a gas manifold in the cold plate communicable with a source of the thermally conductive gas an inlet through the cold plate from the gas manifold and opening out to the cold plate interface. The reactor can further include an O-ring apparatus sandwiched between the cold plate and the thermal conductor and defining a gas-containing volume in the cold plate interface in communication with the inlet from the cold plate. The gas-containing volume preferably is of nearly infinitesimal thickness. The thermal conductor can be integrally formed with the reactor enclosure portion. Alternatively, the thermal conductor can be formed separately from the reactor enclosure portion whereby a reactor enclosure interface is defined between the reactor enclosure portion and the thermal conductor, in which case preferably there is a thermally conductive substance within the reactor enclosure interface for reducing the thermal resistance across the reactor enclosure interface. The thermally conductive substance in the reactor enclosure interface can be a thermally conductive gas filling the reactor enclosure interface. Alternatively, the thermally conductive substance in the reactor enclosure interface includes a thermally conductive solid material. If the thermal conductor is formed separately from the reactor enclosure portion whereby a reactor enclosure interface is defined between the reactor enclosure portion and the thermal conductor, then preferably there is a thermally conductive gas filling the reactor enclosure interface for reducing the thermal resistance across the reactor enclosure interface. In this case, preferably there is a gas channel through the thermal conductor and communicating between the cold plate interface and the reactor enclosure interface. Preferably in this case, there is further an O-ring apparatus between the reactor enclosure portion and the thermal conductor defining a gas-containing volume in the reactor enclosure interface in communication with the gas channel of the thermal conductor. Preferably, the thermally conductive solid material includes a soft metal of the type including one of aluminum, indium, copper, nickel. Alternatively, the thermally conductive solid material includes an elastomer impregnated with particles of a thermally conductive material. The particles can be of a soft metal, such as a thermally conductive material including one of aluminum, indium, copper, nickel. Alternatively, the particles can be of a high electrical resistivity and high thermal conductivity, such as boron nitride, high resistivity silicon carbide, high resistivity silicon, aluminum nitride, aluminum oxide.

BRIEF DESCRIPTION OF THE DRAWINGS

FIG. 4A is a cut-away side view of a plasma reactor employing a single three-dimensional center non-planar solenoid winding.

FIG. 4B is an enlarged view of a portion of the reactor of FIG. 4A illustrating a preferred way of winding the solenoidal winding.

FIG. 18 is a cut-away cross-sectional view illustrating a first embodiment of the present invention having a thermally conductive gas interface at each face of the thermally conductive torus of FIG. 5.

FIG. 19 is a cut-away cross-sectional view illustrating a second embodiment of the present invention having a thermally conductive gas interface at the one face of a thermally conductive torus integrally formed with the semiconductor window electrode.

DETAILED DESCRIPTION OF THE PREFERRED EMBODIMENTS

Figure 1:
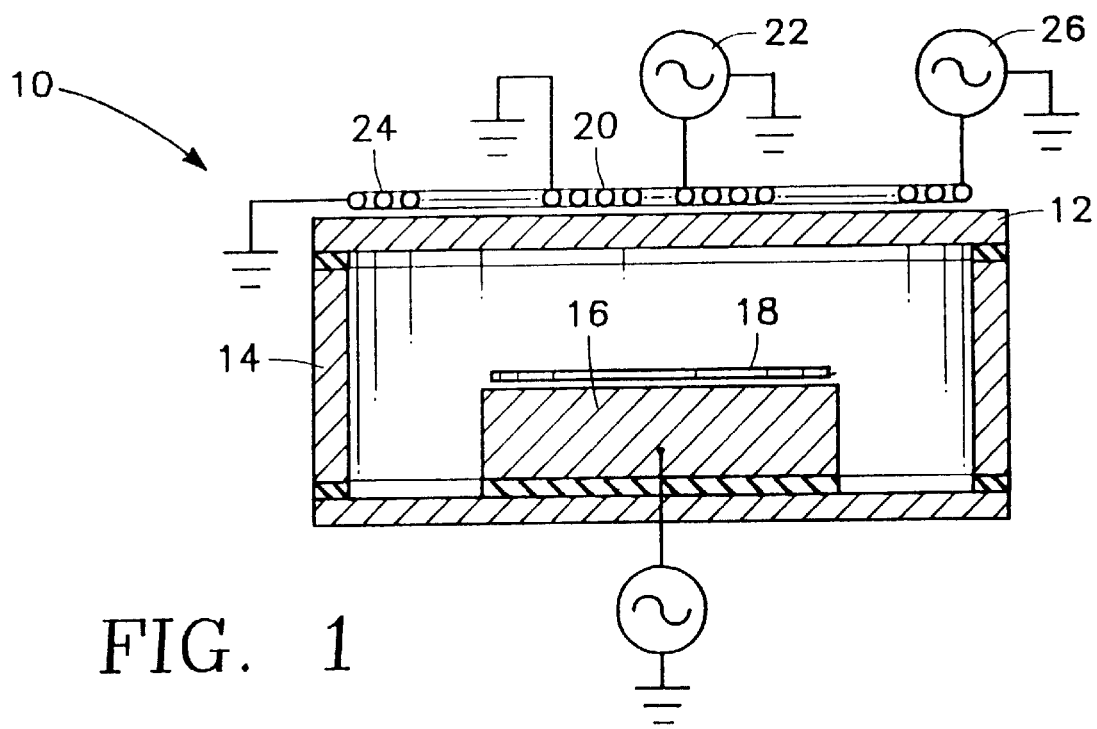
FIG. 1 is a cut-away side view of an inductively coupled plasma reactor of the type employed in a co-pending U.S. patent application referred to above employing generally planar coil antennas.
Figure 2:
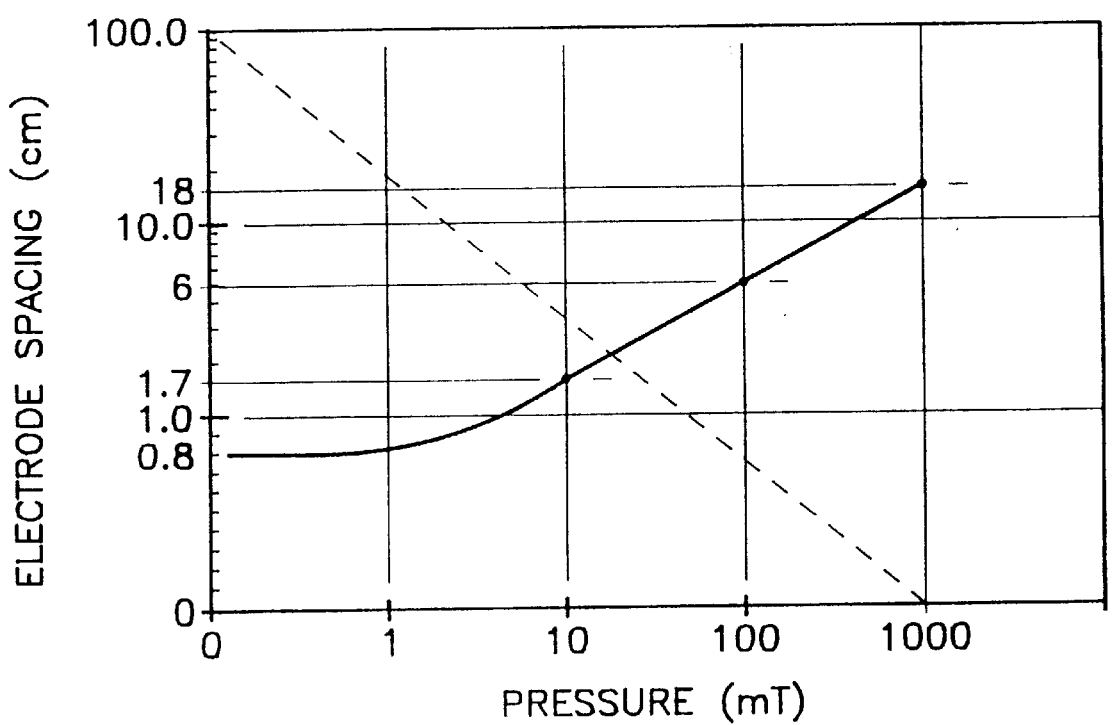
FIG. 2 is a log-log scale graph of induction field skin depth in a plasma in cm (solid line) and of electron-to-neutral elastic collision mean free path length (dashed line) as functions of pressure in torr (horizontal axis).

Disclosure of the Parent Application:

In a plasma reactor having a small antenna-to-workpiece gap, in order to minimize the decrease in plasma ion density near the center region of the workpiece corresponding to the inductive antenna pattern center null, it is an object of the invention to increase the magnitude of the induced electric field at the center region. The invention accomplishes this by concentrating the turns of an inductive coil overlying the ceiling near the axis of symmetry of the antenna and maximizing the rate of change (at the RF source frequency) of magnetic flux linkage between the antenna and the plasma in that center region.

In accordance with the invention, a solenoidal coil around the symmetry axis simultaneously concentrates its inductive coil turns near the axis and maximizes the rate of change of magnetic flux linkage between the antenna and the plasma in the center region adjacent the workpiece. This is because the number of turns is large and the coil radius is small, as required for strong flux linkage and close mutual coupling to the plasma in the center region. (In contrast, a conventional planar coil antenna spreads its inductive field over a wide radial area, pushing the radial power distribution outward toward the periphery.) As understood in this specification, a solenoid-like antenna is one which has plural inductive elements distributed in a non-planar manner relative to a plane of the workpiece or workpiece support surface or overlying chamber ceiling, or spaced at different distances transversely to the workpiece support plane (defined by a workpiece supporting pedestal within the chamber) or spaced at different distances transversely to an overlying chamber ceiling. As understood in this specification, an inductive element is a current-carrying element mutually inductively coupled with the plasma in the chamber and/or with other inductive elements of the antenna.

A preferred embodiment of the invention includes dual solenoidal coil antennas with one solenoid near the center and another one at an outer peripheral radius. The two solenoids may be driven at different RF frequencies or at the same frequency, in which case they are preferably phase-locked and more preferably phase-locked in such a manner that their fields constructively interact. The greatest practical displacement between the inner and outer solenoid is preferred because it provides the most versatile control of etch rate at the workpiece center relative to etch rate at the workpiece periphery. The skilled worker may readily vary RF power, chamber pressure and electro-negativity of the process gas mixture (by choosing the appropriate ratio of molecular and inert gases) to obtain a wider range or process window in which to optimize (using the present invention) the radial uniformity of the etch rate across the workpiece. Maximum spacing between the separate inner and outer solenoids of the preferred embodiment provides the following advantages:

(1) maximum uniformity control and adjustment;
(2) maximum isolation between the inner and outer solenoids, preventing interference of the field from one solenoid with that of the other; and (3) maximum space on the ceiling (between the inner and outer solenoids) for temperature control elements to optimize ceiling temperature control.

Figure 4C:
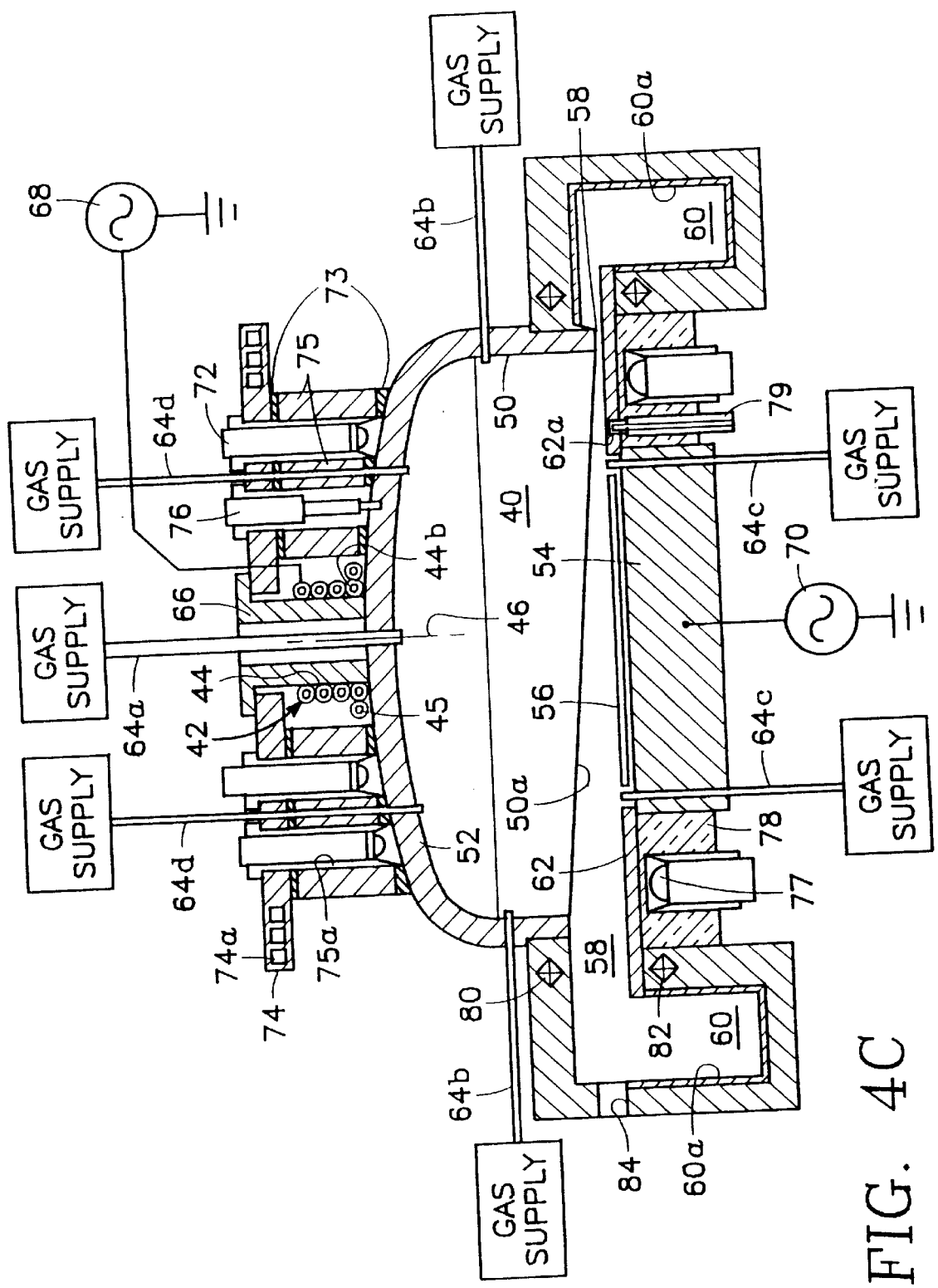
FIG. 4C is a cut-away side view of a plasma reactor corresponding to FIG. 4A but having a dome-shaped ceiling.

FIG. 4A illustrates a single solenoid embodiment (not the preferred embodiment) of an inductively coupled RF plasma reactor having a short workpiece-to-ceiling gap, meaning that the skin depth of the induction field is on the order of the gap length. As understood in this specification, a skin depth which is on the order of the gap length is that which is within a factor of ten of (i.e., between about one tenth and about ten times) the gap length.

Figure 3A:
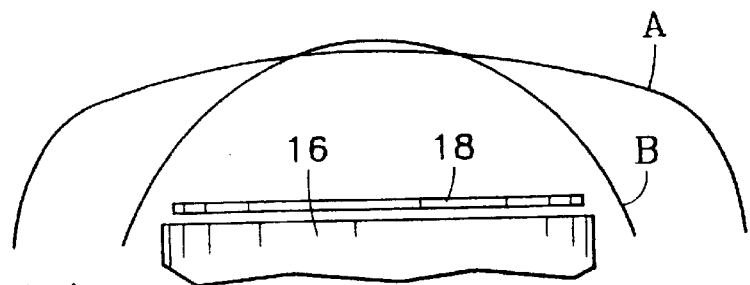
FIG. 3A is a graph of plasma ion density as a function of radial position relative to the workpiece center in the reactor of FIG. 1 for a workpiece-to-ceiling height of 4 inches, the curves labelled A and B corresponding to plasma ion densities produced by outer and inner coil antennas respectively.
Figure 3B:
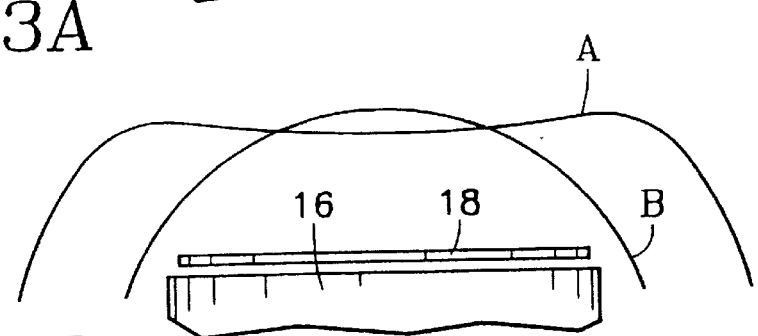
FIG. 3B is a graph of plasma ion density as a function of radial position relative to the workpiece center in the reactor of FIG. 1 for a workpiece-to-ceiling height of 3 inches, the curves labelled A and B corresponding to plasma ion densities produced by outer and inner coil antennas respectively.
Figure 3C:
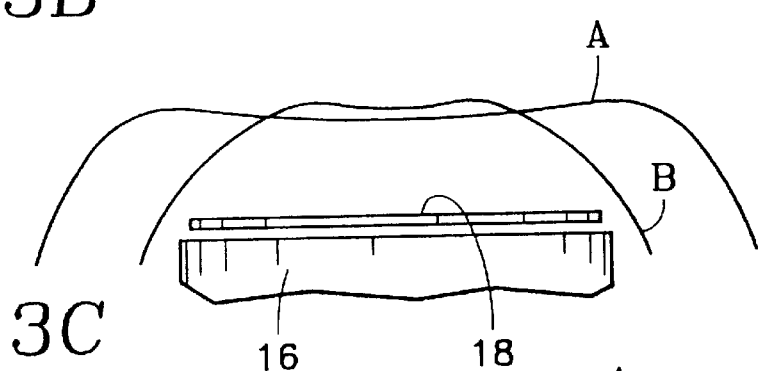
FIG. 3C is a graph of plasma ion density as a function of radial position relative to the workpiece center in the reactor of FIG. 1 for a workpiece-to-ceiling height of 2.5 inches, the curves labelled A and B corresponding to plasma ion densities produced by outer and inner coil antennas respectively.
Figure 3D:
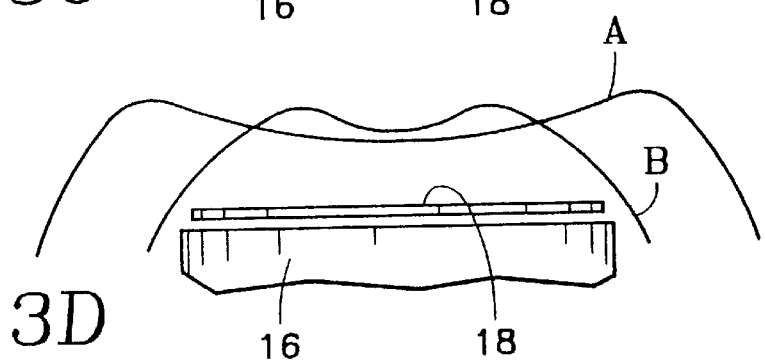
FIG. 3D is a graph of plasma ion density as a function of radial position relative to the workpiece center in the reactor of FIG. 1 for a workpiece-to-ceiling height of 1.25 inches, the curves labelled A and B corresponding to plasma ion densities produced by outer and inner coil antennas respectively.
Figure 3E:
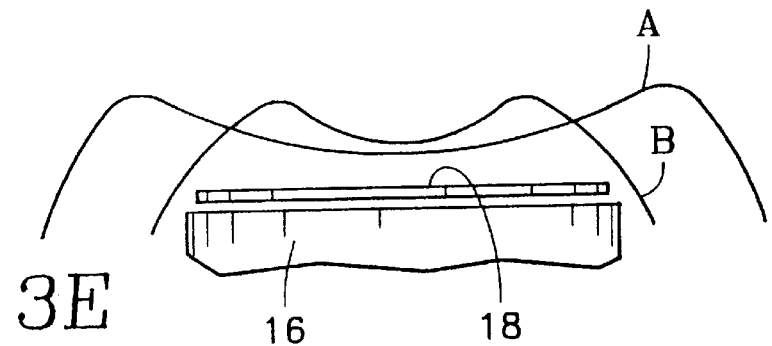
FIG. 3E is a graph of plasma ion density as a function of radial position relative to the workpiece center in the reactor of FIG. 1 for a workpiece-to-ceiling height of 0.8 inches, the curves labelled A and B corresponding to plasma ion densities produced by outer and inner coil antennas respectively.
Figure 5:
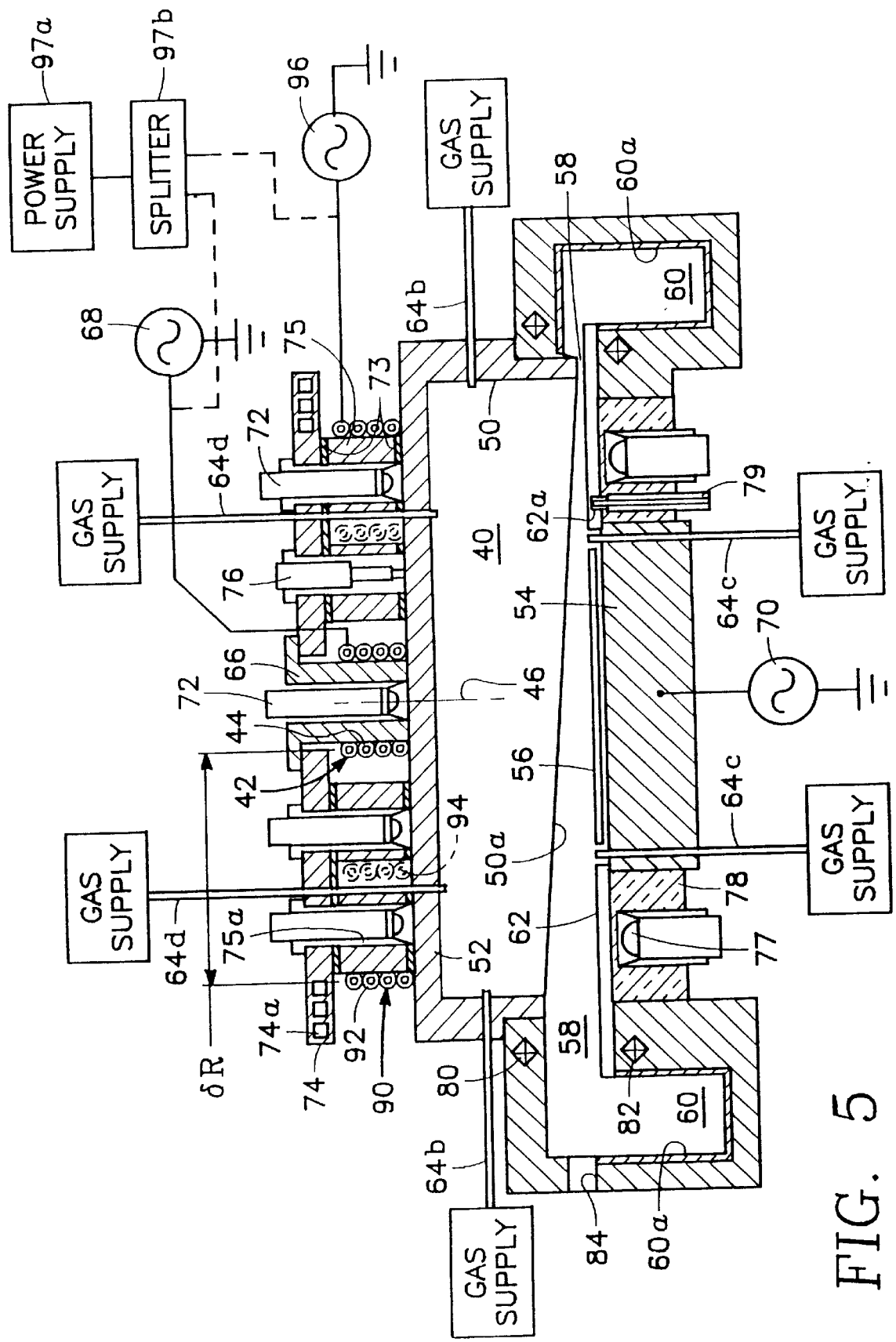
FIG. 5 is a cut-away side view of a plasma reactor employing inner and outer vertical solenoid windings.

FIG. 5 illustrates a dual solenoid embodiment of an inductively coupled RF plasma reactor, and is the preferred embodiment of the invention. Except for the dual solenoid feature, the reactor structure of the embodiments of FIGS. 4A and 5 is nearly the same, and will now be described with reference to FIG. 4A. The reactor includes a cylindrical chamber 40 similar to that of FIG. 1, except that the reactor of FIG. 4A has a non-planar coil antenna 42 whose windings 44 are closely concentrated in non-planar fashion near the antenna symmetry axis 46. While in the illustrated embodiment the windings 44 are symmetrical and their symmetry axis 46 coincides with the center axis of the chamber, the invention may be carried out differently. For example, the windings may not be symmetrical and/or their axis of symmetry may not coincide. However, in the case of a symmetrical antenna, the antenna has a radiation pattern null near its symmetry axis 46 coinciding with the center of the chamber or the workpiece center. Close concentration of the windings 44 about the center axis 46 compensates for this null and is accomplished by vertically stacking the windings 44 in the manner of a solenoid so that they are each a minimum distance from the chamber center axis 46. This increases the product of current (I) and coil turns (N) near the chamber center axis 46 where the plasma ion density has been the weakest for short workpiece-to-ceiling heights, as discussed above with reference to FIGS. 3D and 3E. As a result, the RF power applied to the non-planar coil antenna 42 produces greater induction [d/dt] [N·I] at the wafer center—at the antenna symmetry axis 46—(relative to the peripheral regions) and therefore produces greater plasma ion density in that region, so that the resulting plasma ion density is more nearly uniform despite the small workpiece-to-ceiling height. Thus, the invention provides a way for reducing the ceiling height for enhanced plasma process performance without sacrificing process uniformity.

The drawing of FIG. 4B best shows a preferred implementation of the windings employed in the embodiments of FIGS. 4A and 5. In order that the windings 44 be at least nearly parallel to the plane of the workpiece 56, they preferably are not wound in the usual manner of a helix but, instead, are preferably wound so that each individual turn is parallel to the (horizontal) plane of the workpiece 56 except at a step or transition 44a between turns (from one horizontal plane to the next).

Figure 4D:
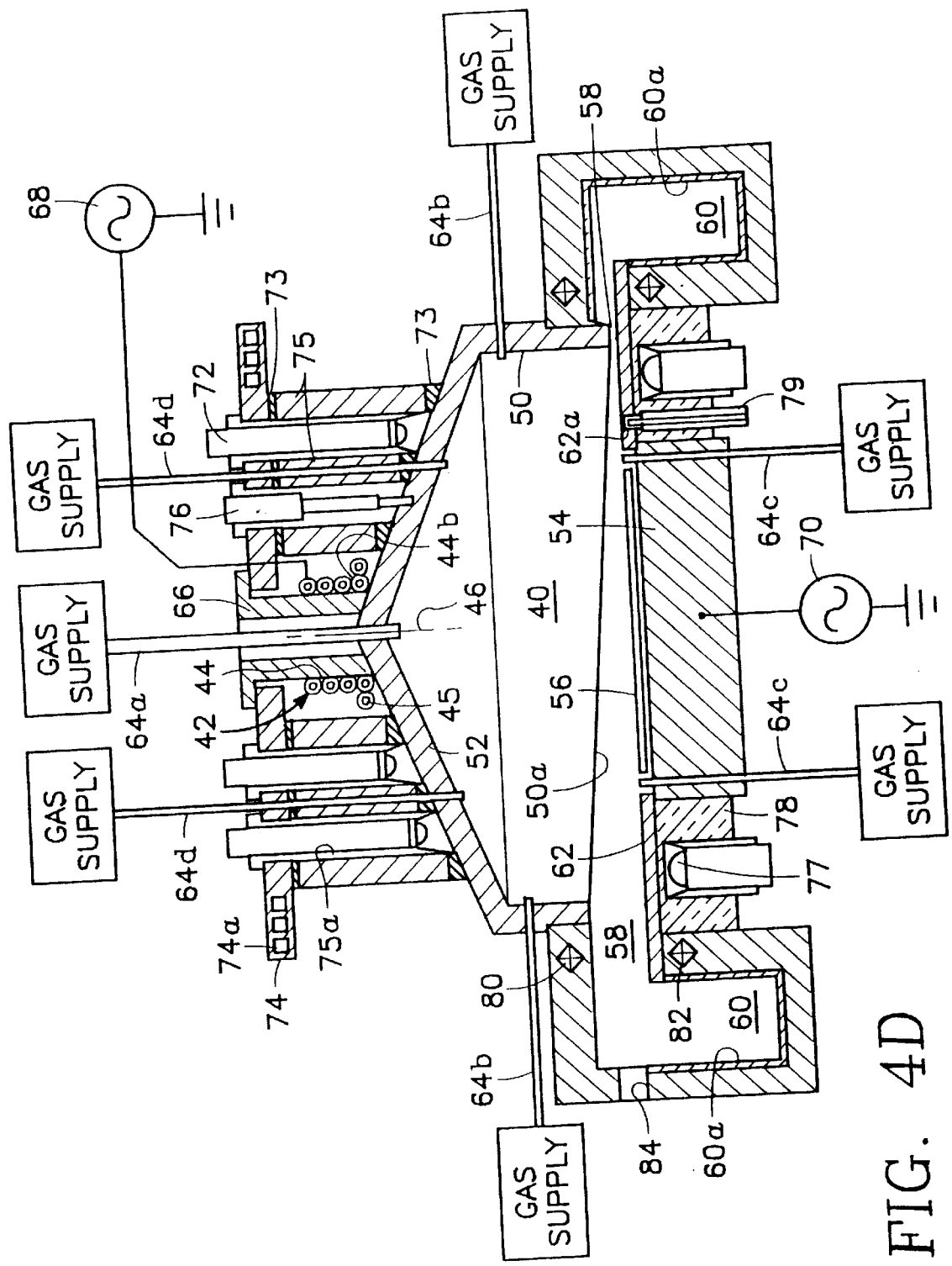
FIG. 4D is a cut-away side view of a plasma reactor corresponding to FIG. 4A but having a conical ceiling.
Figure 4E:
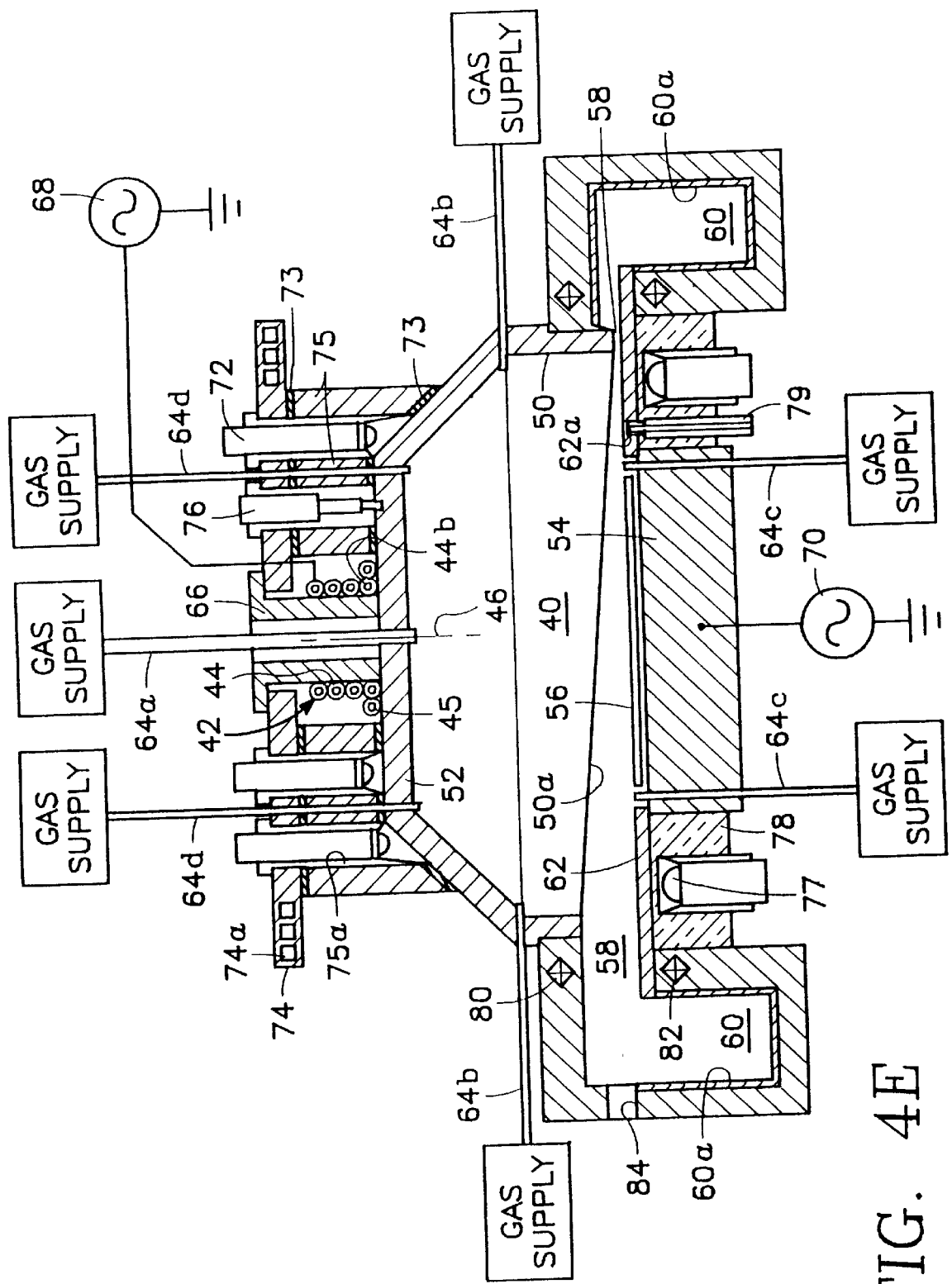
FIG. 4E is a cut-away side view of a plasma reactor corresponding to FIG. 4D but having a truncated conical ceiling.

The cylindrical chamber 40 consists of a cylindrical side wall 50 and a circular ceiling 52 integrally formed with the side wall 50 so that the side wall 50 and ceiling 52 constitute a single piece of material, such as silicon. However, the invention may be carried out with the side wall 50 and ceiling 52 formed as separate pieces, as will be described later in this specification. The circular ceiling 52 may be of any suitable cross-sectional shape such as planar (FIG. 4A), dome (FIG. 4C), conical (FIG. 4D), truncated conical (FIG. 4E), cylindrical or any combination of such shapes or curve of rotation. Such a combination will be discussed later in this specification. Generally, the vertical pitch of the solenoid 42 (i.e., its vertical height divided by its horizontal width) exceeds the vertical pitch of the ceiling 52, even for ceilings defining 3-dimensional surfaces such as dome, conical, truncated conical and so forth. The purpose for this, at least in the preferred embodiment, is to concentrate the induction of the antenna near the antenna symmetry axis, as discussed previously in this specification. A solenoid having a pitch exceeding that of the ceiling is referred to herein as a non-conformal solenoid, meaning that, in general, its shape does not conform with the shape of the ceiling, and more specifically that its vertical pitch exceeds the vertical pitch of the ceiling. A 2-dimensional or flat ceiling has a vertical pitch of zero, while a 3-dimensional ceiling has a non-zero vertical pitch.

A pedestal 54 at the bottom of the chamber 40 supports a planar workpiece 56 in a workpiece support plane during processing. The workpiece 56 is typically a semiconductor wafer and the workpiece support plane is generally the plane of the wafer or workpiece 56. The chamber 40 is evacuated by a pump (not shown in the drawing) through an annular passage 58 to a pumping annulus 60 surrounding the lower portion of the chamber 40. The interior of the pumping annulus may be lined with a replaceable metal liner 60a. The annular passage 58 is defined by the bottom edge 50a of the cylindrical side wall 50 and a planar ring 62 surrounding the pedestal 54. Process gas is furnished into the chamber 40 through any one or all of a variety of gas feeds. In order to control process gas flow near the workpiece center, a center gas feed 64a can extend downwardly through the center of the ceiling 52 toward the center of the workpiece 56 (or the center of the workpiece support plane). In order to control gas flow near the workpiece periphery (or near the periphery of the workpiece support plane), plural radial gas feeds 64b, which can be controlled independently of the center gas feed 64a, extend radially inwardly from the side wall 50 toward the workpiece periphery (or toward the workpiece support plane periphery), or base axial gas feeds 64c extend upwardly from near the pedestal 54 toward the workpiece periphery, or ceiling axial gas feeds 64d can extend downwardly from the ceiling 52 toward the workpiece periphery. Etch rates at the workpiece center and periphery can be adjusted independently relative to one another to achieve a more radially uniform etch rate distribution across the workpiece by controlling the process gas flow rates toward the workpiece center and periphery through, respectively, the center gas feed 64a and any one of the outer gas feeds 64b–d. This feature of the invention can be carried out with the center gas feed 64a and only one of the peripheral gas feeds 64b–d.

The solenoidal coil antenna 42 is wound around a housing 66 surrounding the center gas feed 64. A plasma source RF power supply 68 is connected across the coil antenna 42 and a bias RF power supply 70 is connected to the pedestal 54.

Confinement of the overhead coil antenna 42 to the center region of the ceiling 52 leaves a large portion of the top surface of the ceiling 52 unoccupied and therefore available for direct contact with temperature control apparatus including, for example, plural radiant heaters 72 such as tungsten halogen lamps and a water-cooled cold plate 74 which may be formed of copper or aluminum for example, with coolant passages 74a extending therethrough. Preferably the coolant passages 74a contain a coolant of a known variety having a high thermal conductivity but a low electrical conductivity, to avoid electrically loading down the antenna or solenoid 42. The cold plate 74 provides constant cooling of the ceiling 52 while the maximum power of the radiant heaters 72 is selected so as to be able to overwhelm, if necessary, the cooling by the cold plate 74, facilitating responsive and stable temperature control of the ceiling 52. The large ceiling area irradiated by the heaters 72 provides greater uniformity and efficiency of temperature control. (It should be noted that radiant heating is not necessarily required in carrying out the invention, and the skilled worker may choose to employ an electric heating element instead, as will be described later in this specification.) If the ceiling 52 is silicon, as disclosed in co-pending U.S. application Ser. No. 08/597,577 filed Feb. 2, 1996 by Kenneth S. Collins et al., then there is a significant advantage to be gained by thus increasing the uniformity and efficiency of the temperature control across the ceiling. Specifically, where a polymer precursor and etchant precursor process gas (e.g., a fluorocarbon gas) is employed and where it is desirable to scavenge the etchant (e.g., fluorine), the rate of polymer deposition across the entire ceiling 52 and/or the rate at which the ceiling 52 furnishes a fluorine etchant scavenger material (silicon) into the plasma is better controlled by increasing the contact area of the ceiling 52 with the temperature control heater 72. The solenoid antenna 42 increases the available contact area on the ceiling 52 because the solenoid windings 44 are concentrated at the center axis of the ceiling 52.

The increase in available area on the ceiling 52 for thermal contact is exploited in a preferred implementation by a highly thermally conductive torus 75 (formed of a ceramic such as aluminum nitride, aluminum oxide or silicon nitride or of a non-ceramic like silicon or silicon carbide either lightly doped or undoped) whose bottom surface rests on the ceiling 52 and whose top surface supports the cold plate 74. One feature of the torus 75 is that it displaces the cold plate 74 well-above the top of the solenoid 42. This feature substantially mitigates or nearly eliminates the reduction in inductive coupling between the solenoid 42 and the plasma which would otherwise result from a close proximity of the conductive plane of the cold plate 74 to the solenoid 42. In order to prevent such a reduction in inductive coupling, it is preferable that the distance between the cold plate 74 and the top winding of the solenoid 42 be at least a substantial fraction (e.g., one half) of the total height of the solenoid 42. Plural axial holes 75a extending through the torus 75 are spaced along two concentric circles and hold the plural radiant heaters or lamps 72 and permit them to directly irradiate the ceiling 52. For greatest lamp efficiency, the hole interior surface may be lined with a reflective (e.g., aluminum) layer. The center gas feed 64a of FIG. 4 may be replaced by a radiant heater 72 (as shown in FIG. 5), depending upon the particular reactor design and process conditions. The ceiling temperature is sensed by a sensor such as a thermocouple 76 extending through one of the holes 75a not occupied by a lamp heater 72. For good thermal contact, a highly thermally conductive elastomer 73 such as silicone rubber impregnated with boron nitride is placed between the ceramic torus 75 and the copper cold plate 74 and between the ceramic torus 75 and the silicon ceiling 52.

As disclosed in the above-referenced co-pending application, the chamber 40 may be an all-semiconductor chamber, in which case the ceiling 52 and the side wall 50 are both a semiconductor material such as silicon or silicon carbide. As described in the above-referenced co-pending application, controlling the temperature of, and RF bias power applied to, either the ceiling 52 or the wall 50 regulates the extent to which it furnishes fluorine scavenger precursor material (silicon) into the plasma or, alternatively, the extent to which it is coated with polymer. The material of the ceiling 52 is not limited to silicon but may be, in the alternative, silicon carbide, silicon dioxide (quartz), silicon nitride, aluminum nitride or a ceramic such as aluminum oxide.

As described in the above-referenced co-pending application, the chamber wall or ceiling 50, 52 need not be used as the source of a fluorine scavenger material. Instead, a disposable semiconductor (e.g., silicon or silicon carbide) member can be placed inside the chamber 40 and maintained at a sufficiently high temperature to prevent polymer condensation thereon and permit silicon material to be removed therefrom into the plasma as fluorine scavenging material. In this case, the wall 50 and ceiling 52 need not necessarily be silicon, or if they are silicon they may be maintained at a temperature (and/or RF bias) near or below the polymer condensation temperature (and/or a polymer condensation RF bias threshold) so that they are coated with polymer from the plasma so as to be protected from being consumed. While the disposable silicon member may take any appropriate form, in the embodiment of FIG. 4 the disposable silicon member is an annular ring 62 surrounding the pedestal 54. Preferably, the annular ring 62 is high purity silicon and may be doped to alter its electrical or optical properties. In order to maintain the silicon ring 62 at a sufficient temperature to ensure its favorable participation in the plasma process (e.g., its contribution of silicon material into the plasma for fluorine scavenging), plural radiant (e.g., tungsten halogen lamp) heaters 77 arranged in a circle under the annular ring 62 heat the silicon ring 62 through a quartz window 78. As described in the above-referenced co-pending application, the heaters 77 are controlled in accordance with the measured temperature of the silicon ring 62 sensed by a temperature sensor 79 which may be a remote sensor such as an optical pyrometer or a fluoro-optical probe. The sensor 79 may extend partially into a very deep hole 62a in the ring 62, the deepness and narrowness of the hole tending at least partially to mask temperature-dependent variations in thermal emissivity of the silicon ring 62, so that it behaves more like a gray-body radiator for more reliable temperature measurement.

As described in U.S. application Ser. No. 08/597,577 referred to above, an advantage of an all-semiconductor chamber is that the plasma is free of contact with contaminant producing materials such as metal, for example. For this purpose, plasma confinement magnets 80, 82 adjacent the annular opening 58 prevent or reduce plasma flow into the pumping annulus 60. To the extent any polymer precursor and/or active species succeeds in entering the pumping annulus 60, any resulting polymer or contaminant deposits on the replaceable interior liner 60a may be prevented from re-entering the plasma chamber 40 by maintaining the liner 60a at a temperature significantly below the polymer condensation temperature, for example, as disclosed in the referenced co-pending application.

A wafer slit valve 84 through the exterior wall of the pumping annulus 60 accommodates wafer ingress and egress. The annular opening 58 between the chamber 40 and pumping annulus 60 is larger adjacent the wafer slit valve 84 and smallest on the opposite side by virtue of a slant of the bottom edge of the cylindrical side wall 50 so as to make the chamber pressure distribution more symmetrical with a non-symmetrical pump port location.

Maximum mutual inductance near the chamber center axis 46 is achieved by the vertically stacked solenoidal windings 44. In the embodiment of FIG. 4, another winding 45 outside of the vertical stack of windings 44 but in the horizontal plane of the bottom solenoidal winding 44a may be added, provided the additional winding 45 is close to the bottom solenoidal winding 44*a*.

Referring specifically now to the preferred dual solenoid embodiment of FIG. 5, a second outer vertical stack or solenoid 120 of windings 122 at an outer location (i.e, against the outer circumferential surface of the thermally conductive torus 75) is displaced by a radial distance δR from the inner vertical stack of solenoidal windings 44. Note that in FIG. 5 confinement of the inner solenoidal antenna 42 to the center and the outer solenoidal antenna 120 to the periphery leaves a large portion of the top surface of the ceiling 52 available for direct contact with the temperature control apparatus 72, 74, 75, as in FIG. 4A. An advantage is that the larger surface area contact between the ceiling 52 and the temperature control apparatus provides a more efficient and more uniform temperature control of the ceiling 52.

For a reactor in which the side wall and ceiling are formed of a single piece of silicon for example with an inside diameter of 12.6 in (32 cm), the wafer-to-ceiling gap is 3 in (7.5 cm), and the mean diameter of the inner solenoid was 3.75 in (9.3 cm) while the mean diameter of the outer solenoid was 11.75 in (29.3 cm) using 3/16 in diameter hollow copper tubing covered with a 0.03 thick teflon insulation layer, each solenoid consisting of four turns and being 1 in (2.54 cm) high. The outer stack or solenoid 120 is energized by a second independently controllable plasma source RF power supply 96. The purpose is to permit different user-selectable plasma source power levels to be applied at different radial locations relative to the workpiece or wafer 56 to permit compensation for known processing non-uniformities across the wafer surface, a significant advantage. In combination with the independently controllable center gas feed 64*a* and peripheral gas feeds 64*b–d*, etch performance at the workpiece center may be adjusted relative to etch performance at the edge by adjusting the RF power applied to the inner solenoid 42 relative to that applied to the outer solenoid 90 and adjusting the gas flow rate through the center gas feed 64*a* relative to the flow rate through the outer gas feeds 64*b–d*. While the present invention solves or at least ameliorates the problem of a center null or dip in the inductance field as described above, there may be other plasma processing non-uniformity problems, and these can be compensated in the versatile embodiment of FIG. 5 by adjusting the relative RF power levels applied to the inner and outer antennas. For effecting this purpose with greater convenience, the respective RF power supplies 68, 96 for the inner and outer solenoids 42, 90 may be replaced by a common power supply 97*a* and a power splitter 97*b* which permits the user to change the relative apportionment of power between the inner and outer solenoids 42, 90 while preserving a fixed phase relationship between the fields of the inner and outer solenoids 42, 90. This is particularly important where the two solenoids 42, 90 receive RF power at the same frequency. Otherwise, if the two independent power supplies 68, 96 are employed, then they may be powered at different RF frequencies, in which case it is preferable to install RF filters at the output of each RF power supply 68, 96 to avoid off-frequency feedback from coupling between the two solenoids. In this case, the frequency difference should be sufficient to time-average out coupling between the two solenoids and, furthermore, should exceed the rejection bandwidth of the RF filters. A preferred mode is to make each frequency independently resonantly matched to the respective solenoid, and each frequency may be varied to follow changes in the plasma impedance (thereby maintaining resonance) in lieu of conventional impedance matching techniques. In other words, the RF frequency applied to the antenna is made to follow the resonant frequency of the antenna as loaded by the impedance of the plasma in the chamber. In such implementations, the frequency ranges of the two solenoids should be mutually exclusive. In an alternative mode, the two solenoids are driven at the same RF frequency and in this case it is preferable that the phase relationship between the two be such as to cause constructive interaction or superposition of the fields of the two solenoids. Generally, this requirement will be met by a zero phase angle between the signals applied to the two solenoids if they are both wound in the same sense. Otherwise, if they are oppositely wound, the phase angle is preferably 180°. In any case, coupling between the inner and outer solenoids can be minimized or eliminated by having a relatively large space between the inner and outer solenoids 42, 90, as will be discussed below in this specification.

The range attainable by such adjustments is increased by increasing the radius of the outer solenoid 90 to increase the spacing between the inner and outer solenoids 42, 90, so that the effects of the two solenoids 42, 90 are more confined to the workpiece center and edge, respectively. This permits a greater range of control in superimposing the effects of the two solenoids 42, 90. For example, the radius of the inner solenoid 42 should be no greater than about half the workpiece radius and preferably no more than about a third thereof. (The minimum radius of the inner solenoid 42 is affected in part by the diameter of the conductor forming the solenoid 42 and in part by the need to provide a finite non-zero circumference for an arcuate—e.g., circular—current path to produce inductance.) The radius of the outer coil 90 should be at least equal to the workpiece radius and preferably 1.5 or more times the workpiece radius. With such a configuration, the respective center and edge effects of the inner and outer solenoids 42, 90 are so pronounced that by increasing power to the inner solenoid the chamber pressure can be raised into the hundreds of mT while providing a uniform plasma, and by increasing power to the outer solenoid 90 the chamber pressure can be reduced to on the order of 0.01 mT while providing a uniform plasma. Another advantage of such a large radius of the outer solenoid 90 is that it minimizes coupling between the inner and outer solenoids 42, 90.

FIG. 5 indicates in dashed line that a third solenoid may be added as an option, which is desirable for a very large chamber diameter.

Figure 6:
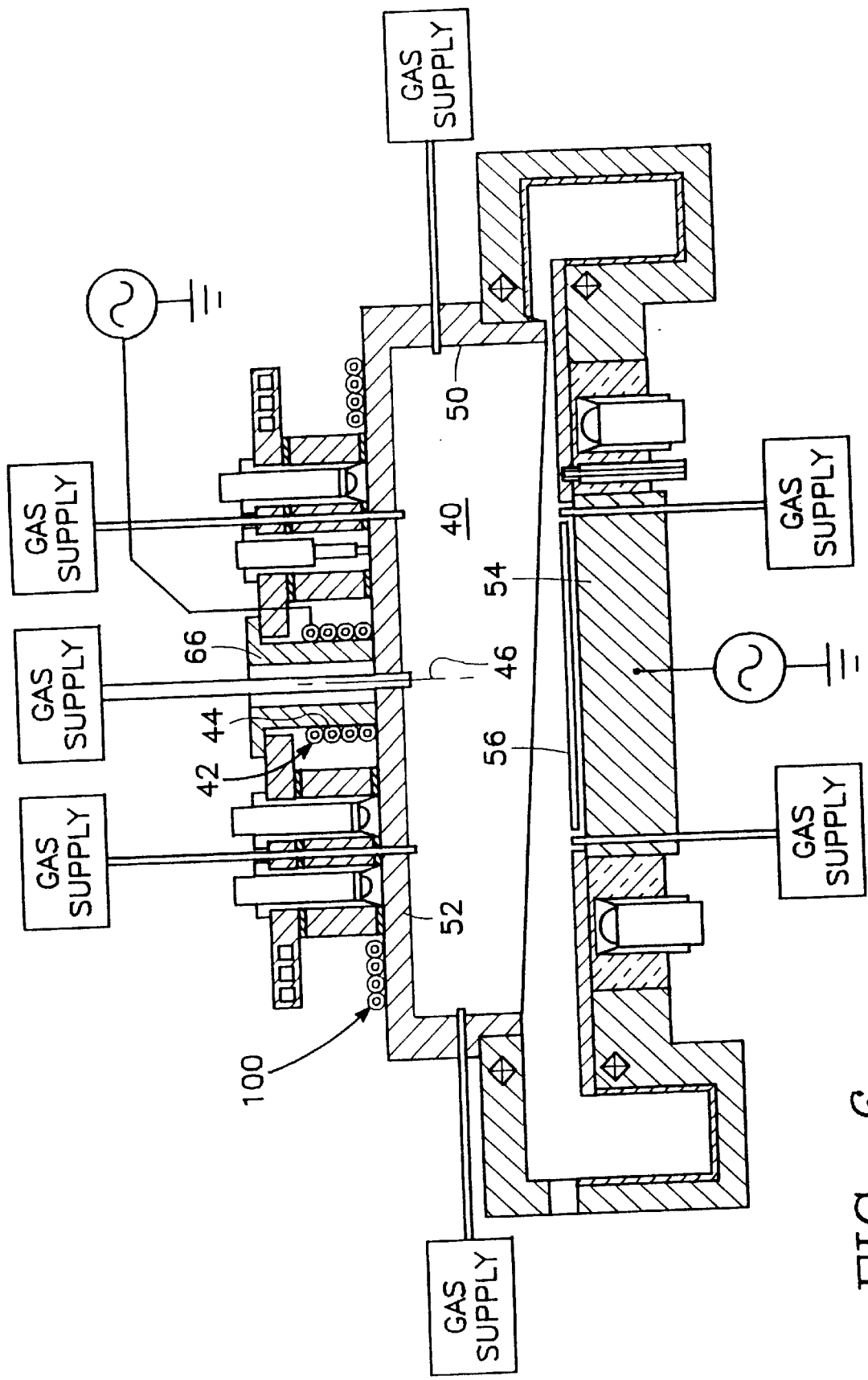
FIG. 6 is a cut-away side view of a plasma reactor corresponding to FIG. 5 in which the outer winding is flat.

FIG. 6 illustrates a variation of the embodiment of FIG. 5 in which the outer solenoid 90 is replaced by a planar winding 100.

Figure 7:
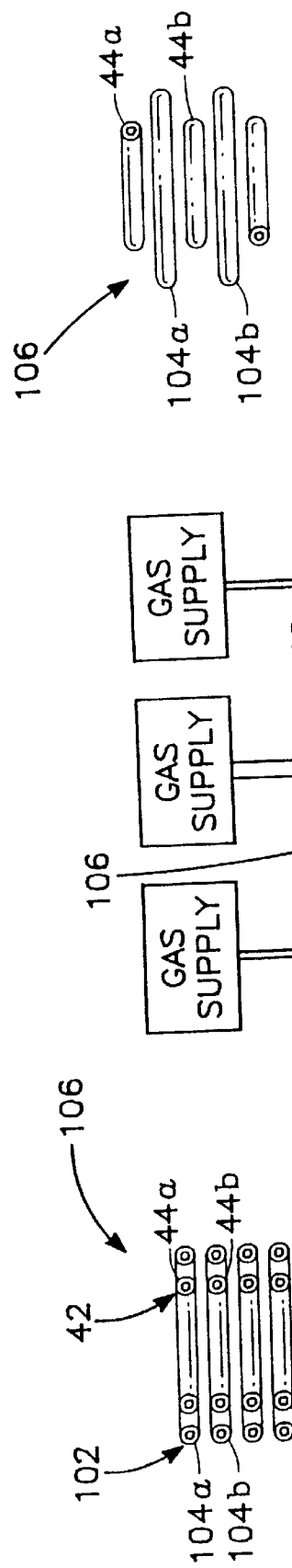
FIG. 7A is a cut-away side view of a plasma reactor corresponding to FIG. 4 in which the center solenoid winding consists of plural upright cylindrical windings.
FIG. 7B is a detailed view of a first implementation of the embodiment of FIG. 7A.
FIG. 7C is a detailed view of a second implementation of the embodiment of FIG. 7A.

FIG. 7A illustrates a variation of the embodiment of FIG. 4 in which the center solenoidal winding includes not only the vertical stack 42 of windings 44 but in addition a second vertical stack 102 of windings 104 closely adjacent to the first stack 42 so that the two stacks constitute a double-wound solenoid 106. Referring to FIG. 7B, the doubly wound solenoid 106 may consist of two independently wound single solenoids 42, 102, the inner solenoid 42 consisting of the windings 44*a*, 44*b*, and so forth and the outer solenoid 102 consisting of the winding 104*a*, 104*b* and so forth. Alternatively, referring to FIG. 7C, the doubly wound solenoid 106 may consist of vertically stacked pairs of at least nearly co-planar windings. In the alternative of FIG. 7C, each pair of nearly co-planar windings (e.g., the pair 44*a*, 104*a* or the pair 44*b*, 104*b*) may be formed by helically winding a single conductor. The term "doubly wound" used herein refers to winding of the type shown in either FIG. 7B or 7C. In addition, the solenoid winding may not be merely doubly wound but may be triply wound or more and in general it can consists of plural windings at each plane along the axis of symmetry. Such multiple-wound solenoids may be employed in either one or both the inner and outer solenoids 42, 90 of the dual-solenoid embodiment of FIG. 5.

Figure 8:
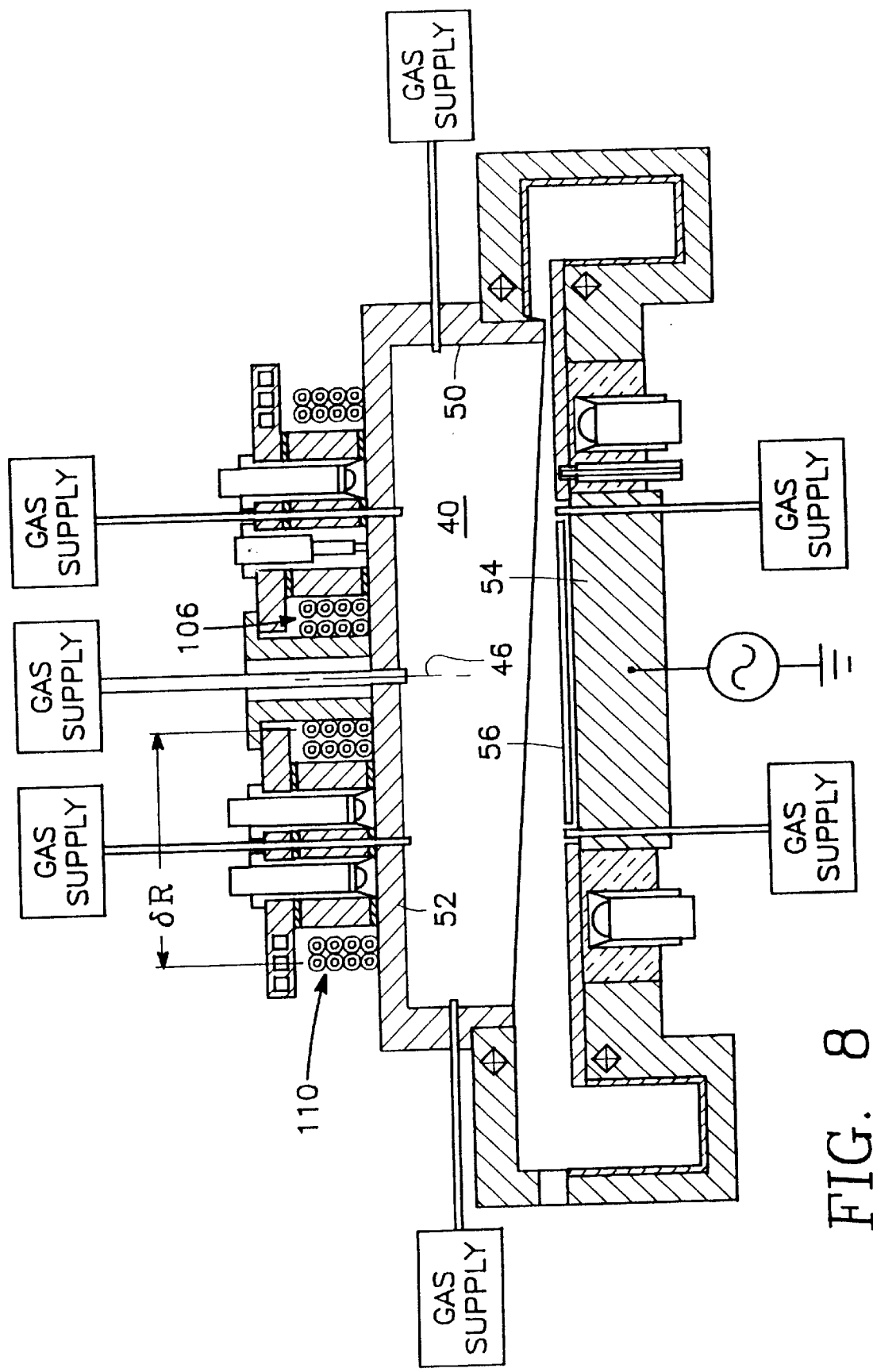
FIG. 8 is a cut-away side view of a plasma reactor corresponding to FIG. 5 in which both the inner and outer windings consist of plural upright cylindrical windings.

FIG. 8 illustrates a variation of the embodiment of FIG. 7A in which an outer doubly wound solenoid 110 concentric with the inner doubly wound solenoid 106 is placed at a radial distance δR from the inner solenoid 106.

Figure 9:
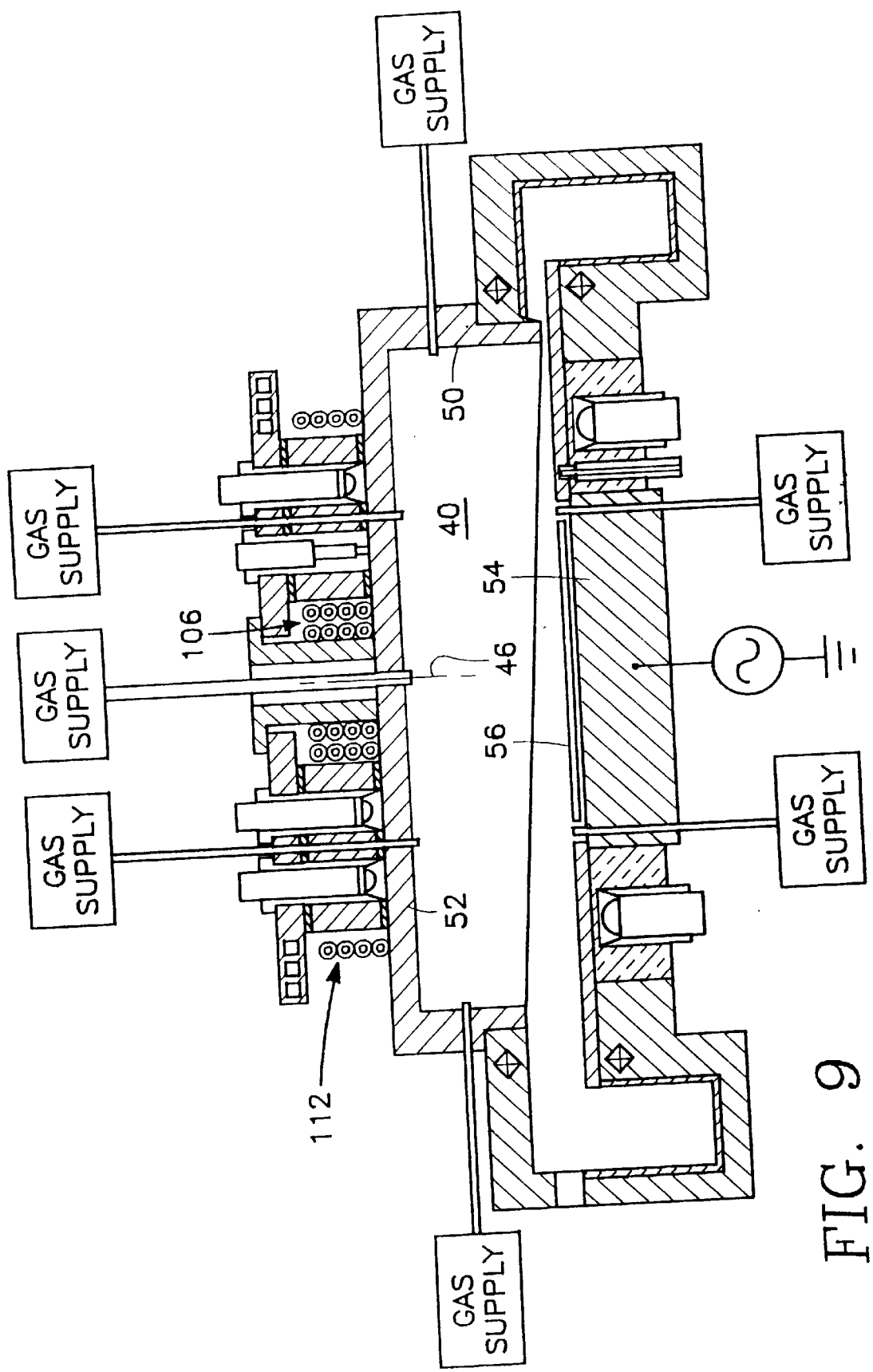
FIG. 9 is a cut-away side view of a plasma reactor corresponding to FIG. 5 in which the inner winding consists of plural upright cylindrical windings and the outer winding consists of a single upright cylindrical winding.

FIG. 9 illustrates a variation of the embodiment of FIG. 8 in which the outer doubly wound solenoid 110 is replaced by an ordinary outer solenoid 112 corresponding to the outer solenoid employed in the embodiment of FIG. 5.

Figure 10:
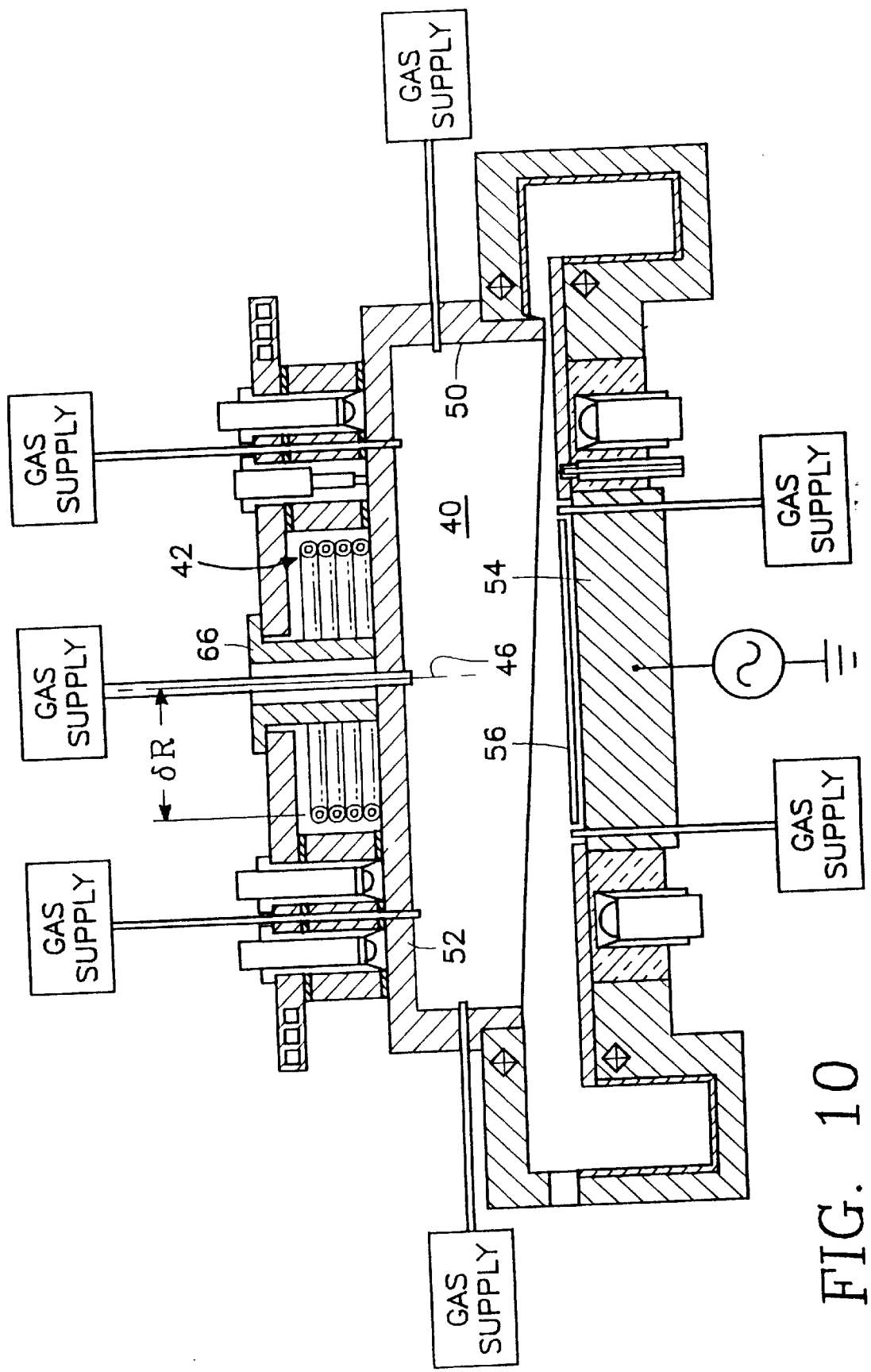
FIG. 10 is a cut-away side view of a plasma reactor in which a single solenoid winding is placed at an optimum radial position for maximum plasma ion density uniformity.

FIG. 10 illustrates another preferred embodiment in which the solenoid 42 of FIG. 5 is placed at a location displaced by a radial distance δr from the center gas feed housing 66. In the embodiment of FIG. 4, δr is zero while in the embodiment of FIG. 10 δr is a significant fraction of the radius of the cylindrical side wall 50. Increasing δr to the extent illustrated in FIG. 10 may be helpful as an alternative to the embodiments of FIGS. 4, 5, 7 and 8 for compensating for non-uniformities in addition to the usual center dip in plasma ion density described with reference to FIGS. 3D and 3E. Similarly, the embodiment of FIG. 10 may be helpful where placing the solenoid 42 at the minimum distance from the chamber center axis 46 (as in FIG. 4) would so increase the plasma ion density near the center of the wafer 56 as to over-correct for the usual dip in plasma ion density near the center and create yet another non-uniformity in the plasma process behavior. In such a case, the embodiment of FIG. 10 is preferred where δr is selected to be an optimum value which provides the greatest uniformity in plasma ion density. Ideally in this case, δr is selected to avoid both under-correction and overcorrection for the usual center dip in plasma ion density. The determination of the optimum value for δr can be carried out by the skilled worker by trial and error steps of placing the solenoid 42 at different radial locations and employing conventional techniques to determine the radial profile of the plasma ion density at each step.

Figure 11:
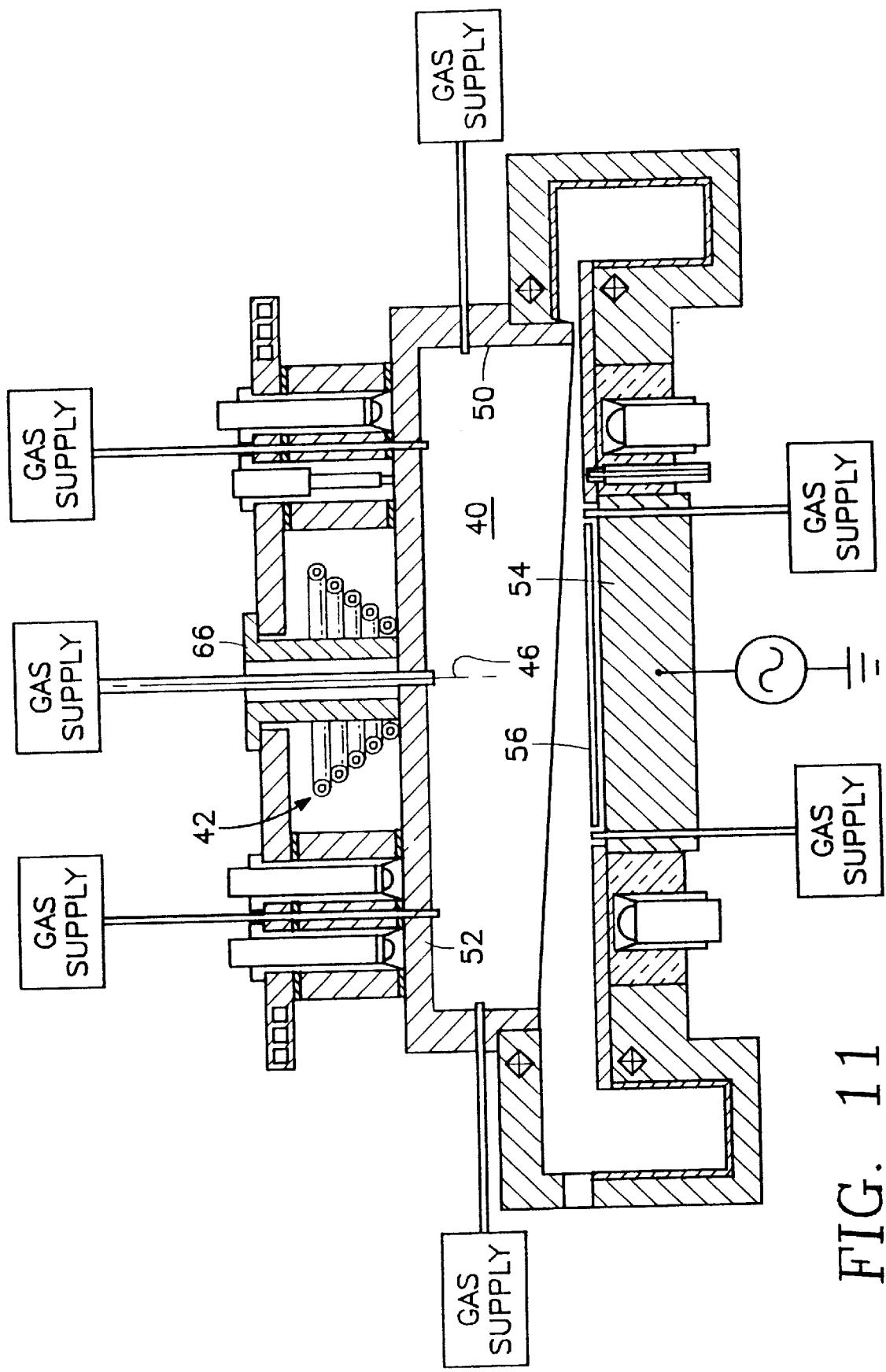
FIG. 11 is a cut-away side view of a plasma reactor corresponding to FIG. 4 in which the solenoid winding is an inverted conical shape.
Figure 12:
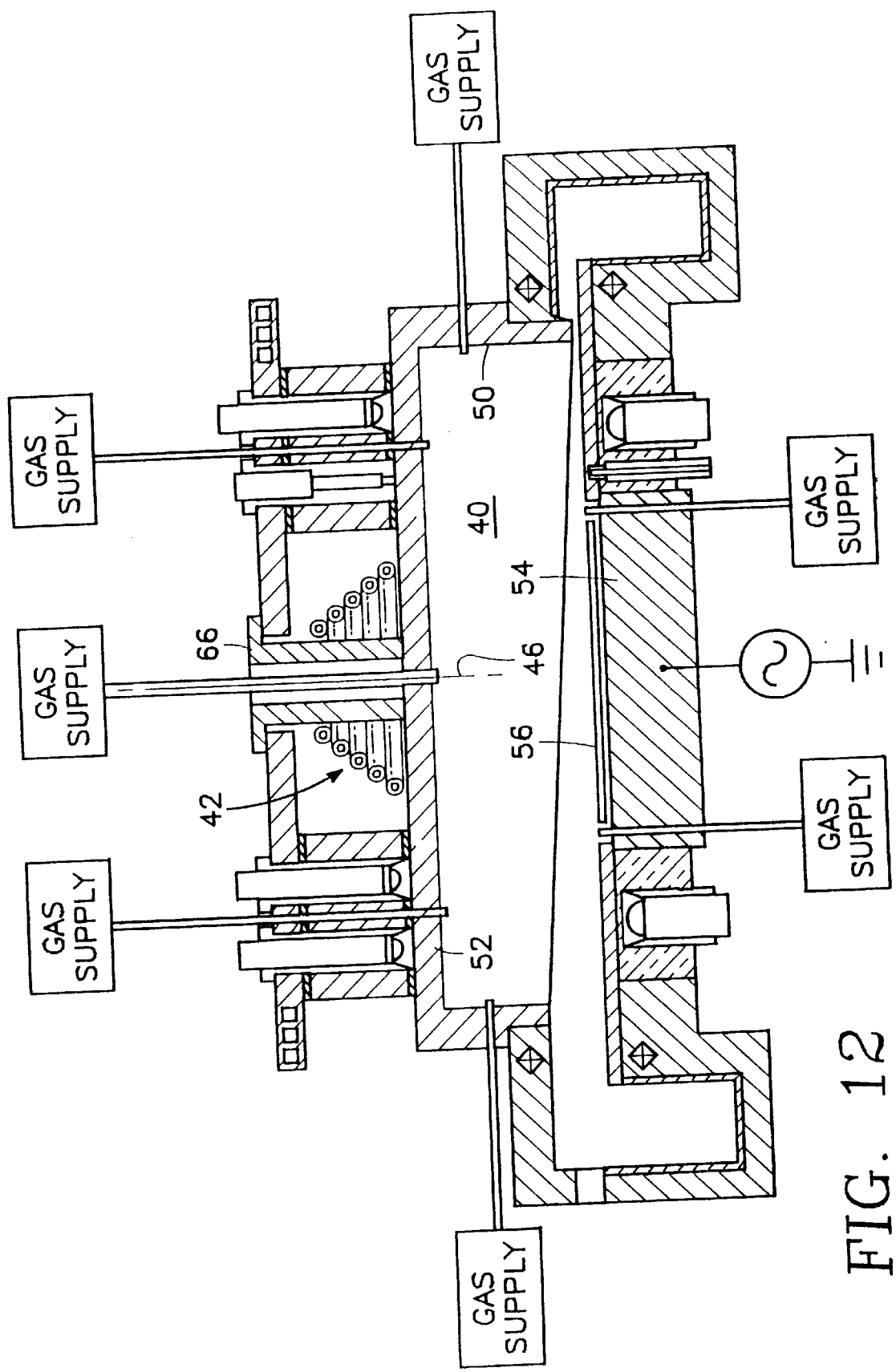
FIG. 12 is a cut-away side view of a plasma reactor corresponding to FIG. 4 in which the solenoid winding is an upright conical shape.

FIG. 11 illustrates an embodiment in which the solenoid 42 has an inverted conical shape while FIG. 12 illustrates an embodiment in which the solenoid 42 has an upright conical shape.

Figure 13:
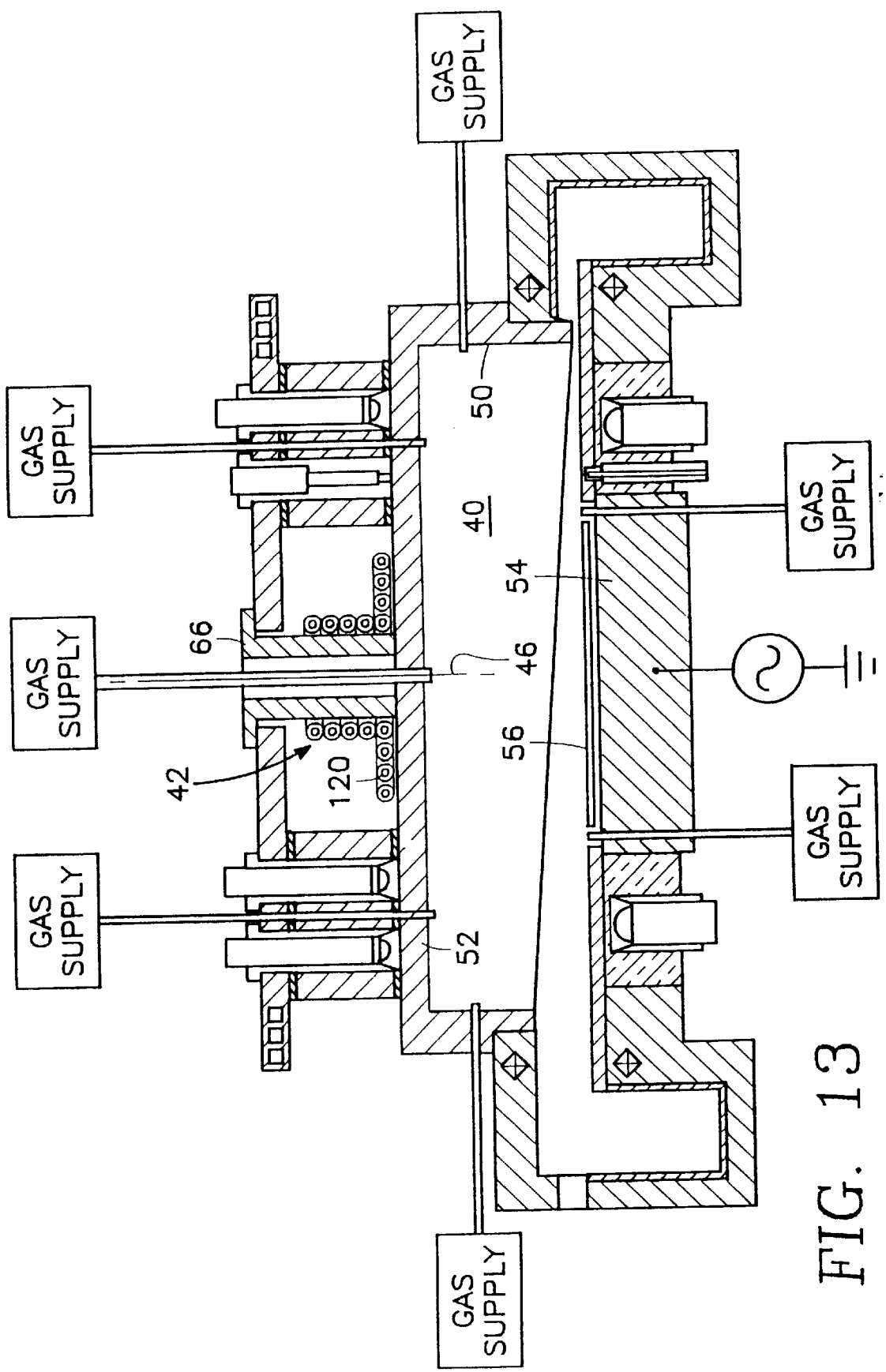
FIG. 13 is a cut-away side view of a plasma reactor in which the solenoid winding consists of an inner upright cylindrical portion and an outer flat portion.
Figure 14:
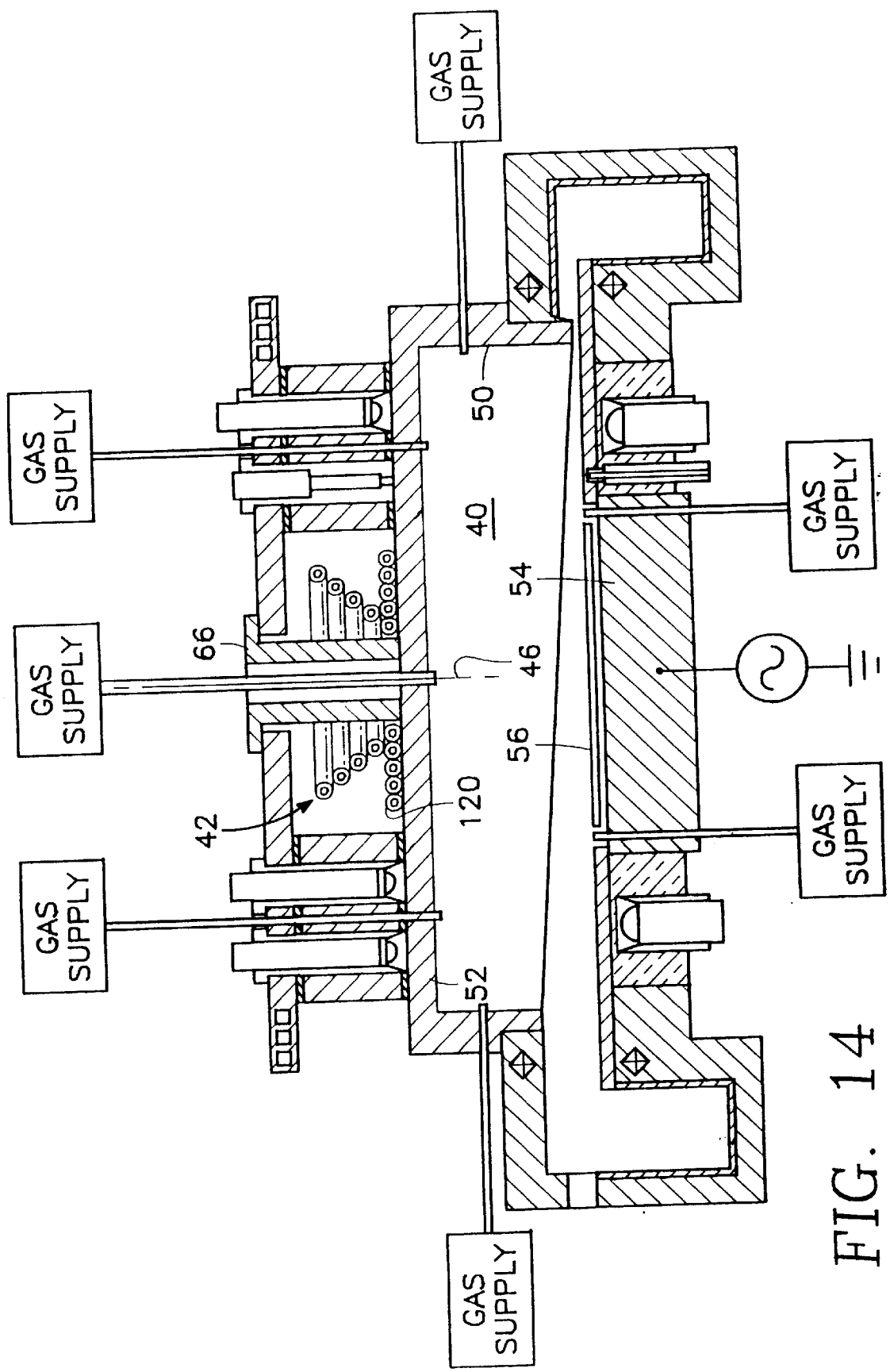
FIG. 14 is a cut-away side view of a plasma reactor corresponding to FIG. 10 in which the solenoid winding includes both an inverted conical portion and a flat portion.
Figure 15:
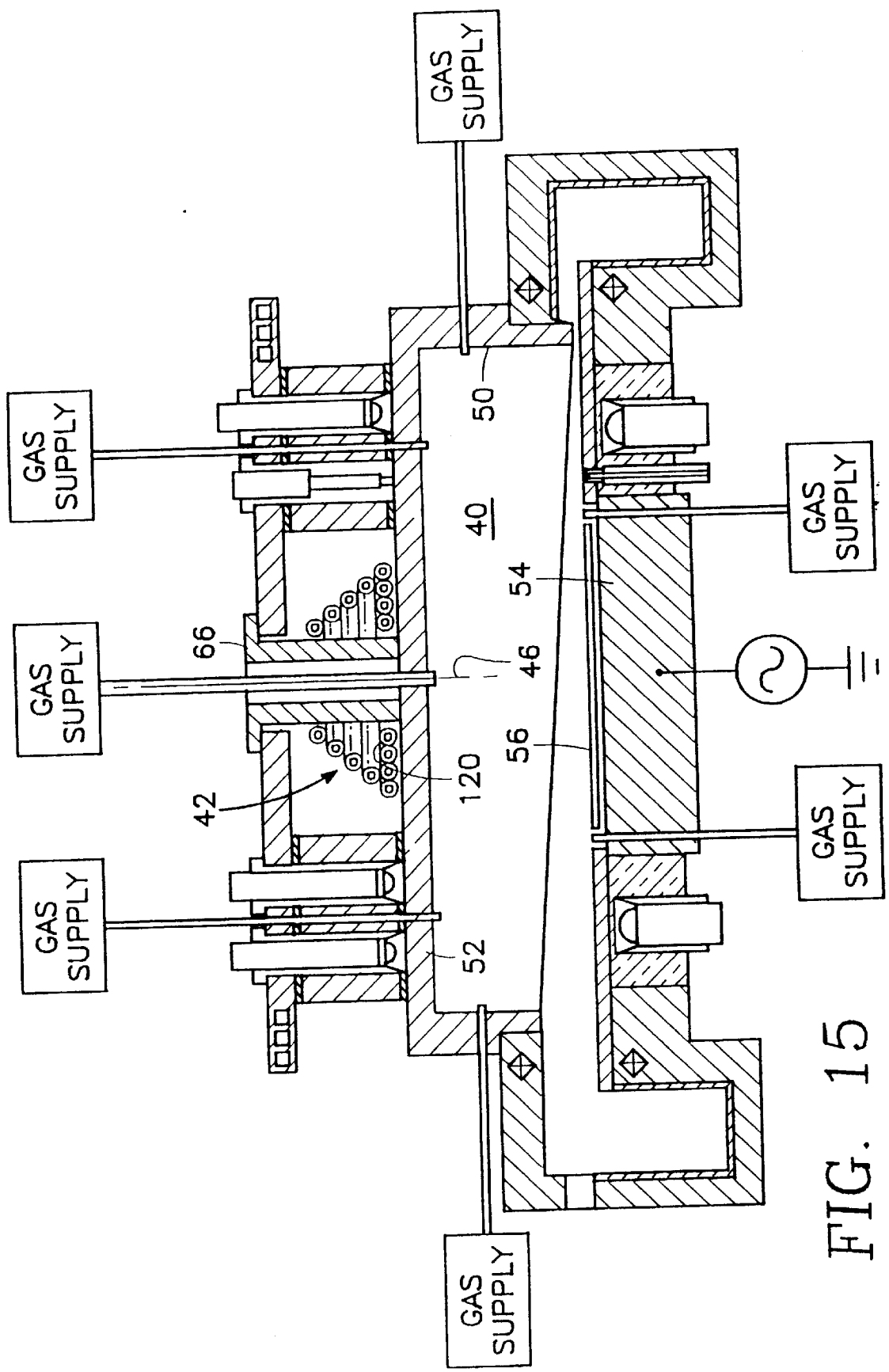
FIG. 15 is a cut-away side view of a plasma reactor corresponding to FIG. 12 in which the solenoid winding includes both an upright conical portion and a flat portion.

FIG. 13 illustrates an embodiment in which the solenoid 42 is combined with a planar helical winding 120. The planar helical winding has the effect of reducing the severity with which the solenoid winding 42 concentrates the induction field near the center of the workpiece by distributing some of the RF power somewhat away from the center. This feature may be useful in cases where it is necessary to avoid over-correcting for the usual center null. The extent of such diversion of the induction field away from the center corresponds to the radius of the planar helical winding 120. FIG. 14 illustrates a variation of the embodiment of FIG. 13 in which the solenoid 42 has an inverted conical shape as in FIG. 11. FIG. 15 illustrates another variation of the embodiment of FIG. 13 in which the solenoid 42 has an upright conical shape as in the embodiment of FIG. 12.

Figure 16:
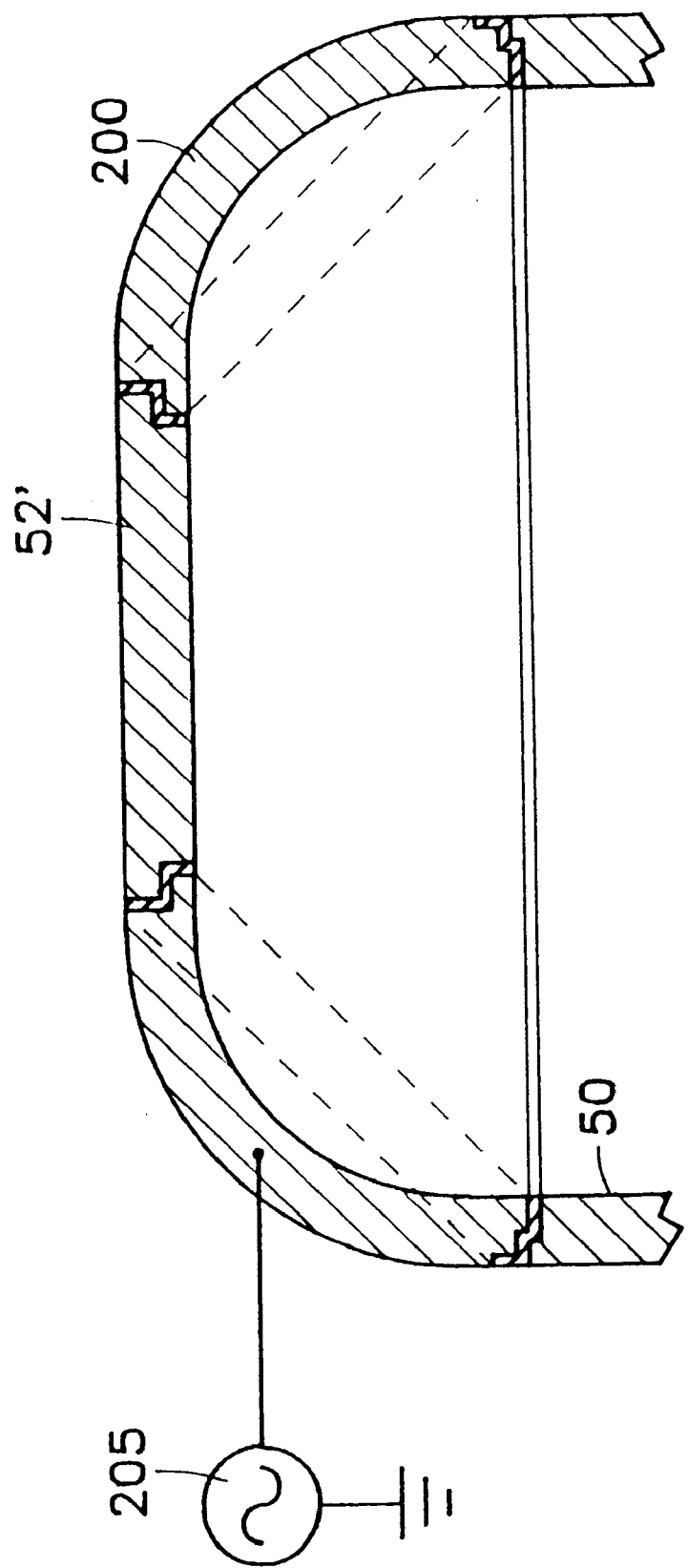
FIG. 16 illustrates a combination of planar, conical and dome-shaped ceiling elements.

The RF potential on the ceiling 52 may be increased, for example to prevent polymer deposition thereon, by reducing its effective capacitive electrode area relative to other electrodes of the chamber (e.g., the workpiece and the sidewalls). FIG. 16 illustrates how this can be accomplished by supporting a smaller-area version of the ceiling 52' on an outer annulus 200, from which the smaller-area ceiling 52' is insulated. The annulus 200 may be formed of the same material (e.g., silicon) as the ceiling 52' and may be of a truncated conical shape (indicated in solid line) or a truncated dome shape (indicated in dashed line). A separate RF power supply 205 may be connected to the annulus 200 to permit more workpiece center versus edge process adjustments.

Figure 17A:
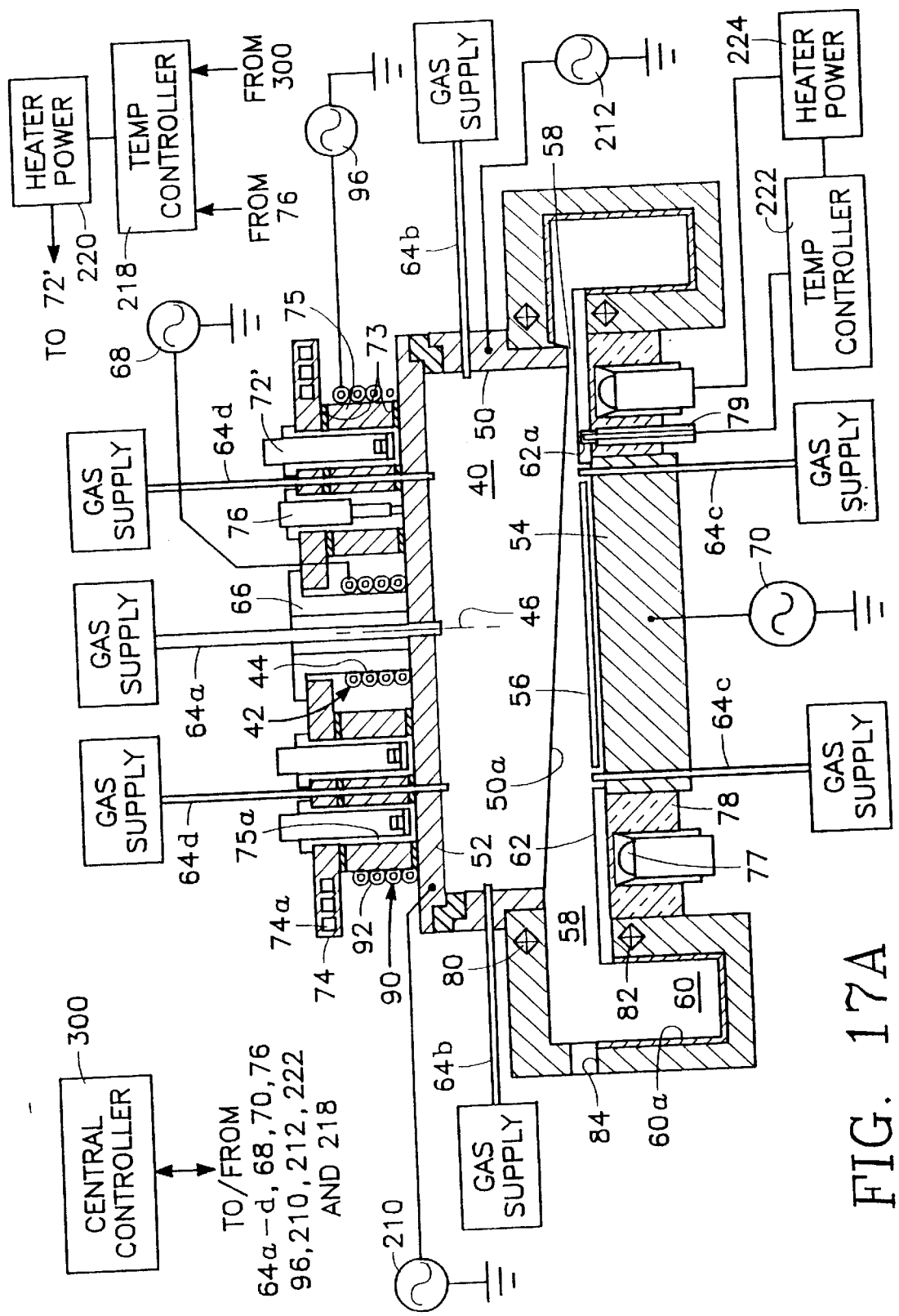
FIG. 17A illustrates a separately biased silicon side wall and ceiling and employing electrical heaters.

FIG. 17A illustrates a variation of the embodiment of FIG. 5 in which the ceiling 52 and side wall 50 are separate semiconductor (e.g., silicon) pieces insulated from one another having separately controlled RF bias power levels applied to them from respective RF sources 210, 212 to enhance control over the center etch rate and selectivity relative to the edge. As set forth in greater detail in above-referenced U.S. application Ser. No. 08/597,577 filed Feb. 2, 1996 by Kenneth S. Collins et al., the ceiling 52 may be a semiconductor (e.g., silicon) material doped so that it will act as an electrode capacitively coupling the RF bias power applied to it into the chamber and simultaneously as a window through which RF power applied to the solenoid 42 may be inductively coupled into the chamber. The advantage of such a window-electrode is that an RF potential may be established directly over the wafer (e.g., for controlling ion energy) while at the same time inductively coupling RF power directly over the wafer. This latter feature, in combination with the separately controlled inner and outer solenoids 42, 90 and center and peripheral gas feeds 64a, 64b greatly enhances the ability to adjust various plasma process parameters such as ion density, ion energy, etch rate and etch selectivity at the workpiece center relative to the workpiece edge to achieve an optimum uniformity. In this combination, gas flow through individual gas feeds is individually and separately controlled to achieve such optimum uniformity of plasma process parameters.

FIG. 17A illustrates how the lamp heaters 72 may be replaced by electric heating elements 72'. As in the embodiment of FIG. 4, the disposable silicon member is an annular ring 62 surrounding the pedestal 54. Preferably, the annular ring 62 is high purity silicon and may be doped to alter its electrical or optical properties. In order to maintain the silicon ring 62 at a sufficient temperature to ensure its favorable participation in the plasma process (e.g., its contribution of silicon material into the plasma for fluorine scavenging), plural radiant (e.g., tungsten halogen lamp) heaters 77 arranged in a circle under the annular ring 62 heat the silicon ring 62 through a quartz window 78. As described in the above-referenced co-pending application, the heaters 77 are controlled in accordance with the measured temperature of the silicon ring 62 sensed by a temperature sensor 79 which may be a remote sensor such as an optical pyrometer or a fluoro-optical probe. The sensor 79 may extend partially into a very deep hole 62a in the ring 62, the deepness and narrowness of the hole tending at least partially to mask temperature-dependent variations in thermal emissivity of the silicon ring 62, so that it behaves more like a gray-body radiator for more reliable temperature measurement.

Figure 17B:
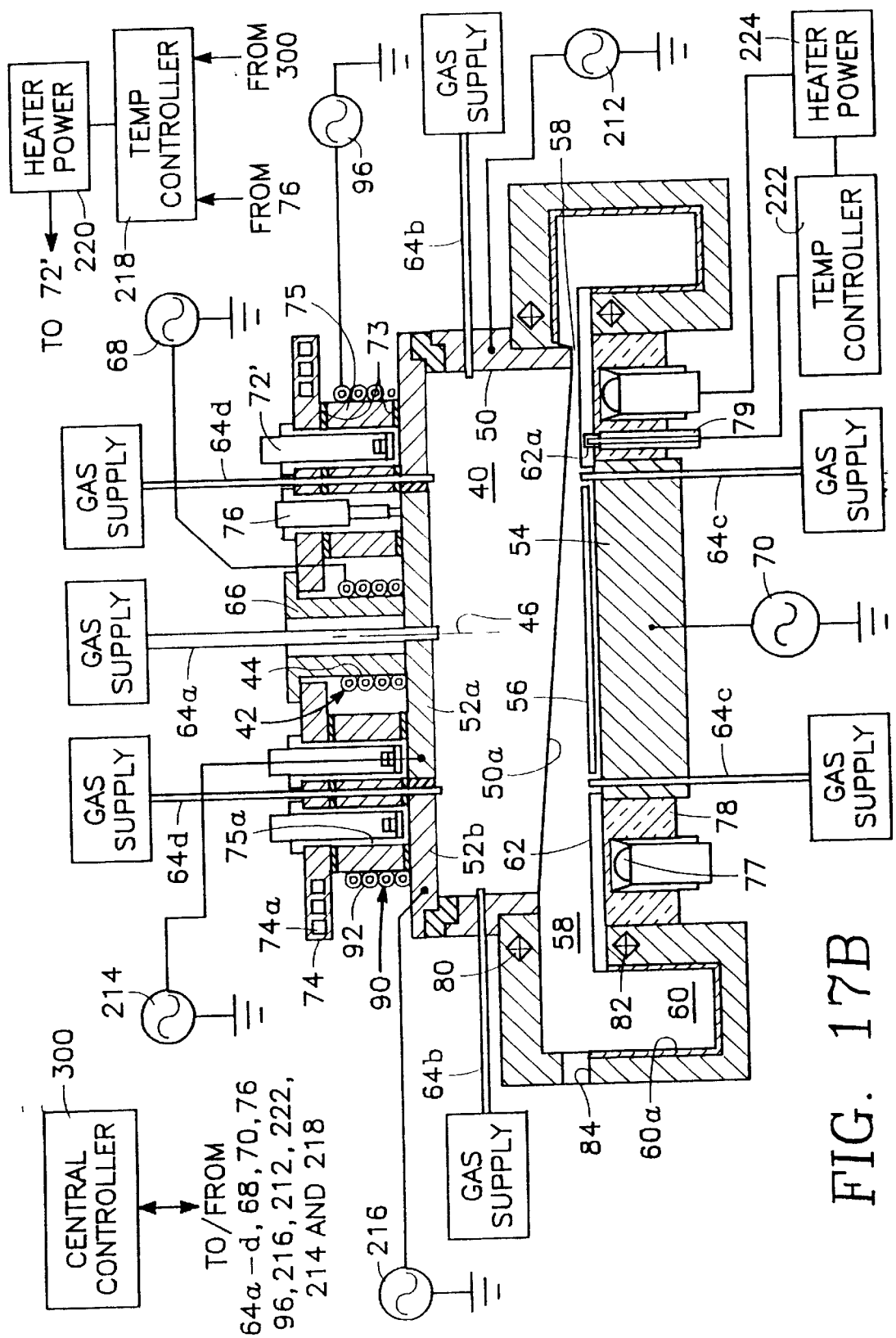
FIG. 17B illustrates separately biased inner and outer silicon ceiling portions and employing electrical heaters.

FIG. 17B illustrates another variation in which the ceiling 52 itself may be divided into an inner disk 52a and an outer annulus 52b electrically insulated from one another and separately biased by independent RF power sources 214, 216 which may be separate outputs of a single differentially controlled RF power source.

In accordance with an alternative embodiment, a user-accessible central controller 300 shown in FIGS. 17A and 17B, such as a programmable electronic controller including, for example, a conventional microprocessor and memory, is connected to simultaneously control gas flow rates through the central and peripheral gas feeds 64a, 64, RF plasma source power levels applied to the inner and outer antennas 42, 90 and RF bias power levels applied to the ceiling 52 and side wall 50 respectively (in FIG. 17A) and the RF bias power levels applied to the inner and outer ceiling portions 52a, 52b (in FIG. 17B), temperature of the ceiling 52 and the temperature of the silicon ring 62. A ceiling temperature controller 218 governs the power applied by a lamp power source 220 to the heater lamps 72' by comparing the temperature measured by the ceiling temperature sensor 76 with a desired temperature known to the controller 300. A ring temperature controller 222 controls the power applied by a heater power source 224 to the heater lamps 77 facing the silicon ring 62 by comparing the ring temperature measured by the ring sensor 79 with a desired ring temperature stored known to the controller 222. The master controller 300 governs the desired temperatures of the temperature controllers 218 and 222, the RF power levels of the solenoid power sources 68, 96, the RF power levels of the bias power sources 210, 212 (FIG. 17A) or 214, 216 (FIG. 17B), the wafer bias level applied by the RF power source 70 and the gas flow rates supplied by the various gas supplies (or separate valves) to the gas inlets 64a–d. The key to controlling the wafer bias level is the RF potential difference between the wafer pedestal 54 and the ceiling 52. Thus, either the pedestal RF power source 70 or the ceiling RF power source 212 may be simply a short to RF ground. With such a programmable integrated controller, the user can easily optimize apportionment of RF source power, RF bias power and gas flow rate between the workpiece center and periphery to achieve the greatest center-to-edge process uniformity across the surface of the workpiece (e.g., uniform radial distribution of etch rate and etch selectivity). Also, by adjusting (through the controller 300) the RF power applied to the solenoids 42, 90 relative to the RF power difference between the pedestal 54 and ceiling 52, the user can operate the reactor in a predominantly inductively coupled mode or in a predominantly capacitively coupled mode.

While the various power sources connected in FIG. 17A to the solenoids 42, 90, the ceiling 52, side wall 50 (or the inner and outer ceiling portions 52a, 52b as in FIG. 17B) have been described as operating at RF frequencies, the invention is not restricted to any particular range of frequencies, and frequencies other than RF may be selected by the skilled worker in carrying out the invention.

In a preferred embodiment of the invention, the high thermal conductivity spacer 75, the ceiling 52 and the side wall 50 are integrally formed together from a single piece of crystalline silicon.

Detailed Description Relating to the Present Invention

Referring again to FIG. 5, a preferred plasma processing chamber includes a window/electrode 52. The window/electrode 52 is fabricated from semiconducting material as described in detail in the above-referenced applications so that it may function as both a window to RF electromagnetic or inductive power coupling from one or more external (outside chamber) antennas or coils to the plasma within the chamber and as an electrode for electrostatically or capacitively coupling RF power to the plasma within the chamber (or for terminating or providing a ground or return path for such capacitive or electrostatic coupling of RF power) or for biasing the workpiece or wafer.

The window/electrode 52 may be any shape as described in the above-referenced applications, but in this example is approximately a flat disc which may optionally include a cylindrical wall or skirt extending outward from the disk, such as for plasma confinement as described in the above-referenced applications.

The window/electrode 52 is interfaced to the heat sink 74 through the heat transfer material 75. Typically the heat sink 74 is a water cooled metal plate, preferably a good thermal conductor such as aluminum or copper, but may optionally be a non-metal. The heat sink 74 typically a cooling apparatus preferably of the type which uses a liquid coolant such as water or ethylene-glycol that is forced through cooling passages of sufficient surface area within the heat sink 74 by a closed-loop heat exchanger or chiller. The liquid flow rate or temperature may be maintained approximately constant. Alternatively, the liquid flow rate or temperature may be an output variable of the temperature control system.

Preferably, radiant heating is used to apply heat to the window/electrode. The radiant heaters 72 are a plurality of tungsten filament lamps utilizing a quartz envelope filled with a mixture of halogen and inert gases. Radiant heaters are preferred to other heater types because thermal lag is minimized: The thermal capacitance of a tungsten filament lamp is very low, such that the time response of filament temperature (and thus of power output) to a change in power setting is short (<1 second), and since the heat transfer mechanism between lamp filament and load is by radiation, the total thermal lag for heating is minimized. In addition, since the heat transfer mechanism between lamp filament and load is by radiation, the total thermal lag for heating is minimized. In addition, since the thermal capacitance of a tungsten filament lamp is very low, the amount of stored thermal energy in the lamp is very low, and when a reduction in heating power is called for by the control system, the filament temperature may be quickly dropped and the lamp output power thus also quickly drops. As shown in FIG. 5, the lamps 72 directly radiate the load (the window/electrode 52) for the fastest possible response. However, alternatively, the lamps 72 may radiate the heat transfer material 75. Lamp heating may be provided in more than one zone, i.e. lamps at two or more radii from the axis of the window/electrode to improve thermal uniformity of window/electrode. For maximum thermal uniformity, lamps in the two or more zones may be provided with separate control, each zone utilizing its own temperature measurement, control system, and output transducer. This is especially useful when the heat flux spatial distribution from inside the chamber varies depending on process parameters, processes, process sequences, or other boundary conditions.

The heat transfer material 75 may be formed integrally with the window/electrode 52 that is formed of the same material into a single piece structure for elimination of a thermal contact resistance that would be present if heat transfer material 75 and window/electrode 52 were two separate parts. Alternatively, the heat transfer material 75 and the window/electrode 52 may be two parts of same or different materials that are bonded together, (preferably with a high electrical resistivity material since the window/electrode 52 is used for inductive or electromagnetic coupling of RF or microwave power using inductive antennas 90, 92 and/or 42, 44), minimizing the thermal contact resistance between the heat transfer material 75 and the window/electrode 52.

Alternatively, the heat transfer material 75 and the window/electrode 52 may be two parts of same or different materials that are interfaced together through a contact resistance. In this case, the heat transfer material 75 is preferably made of a highly thermally conductive material of high electrical resistivity. Additionally, a low product of density and specific heat are preferred. SiC, Si, AlN, and $Al_2O_3$ are examples.

Properties of SiC are indicated below:

| | |
|---|---|
| Thermal conductivity: | 130 watt/meter*Kelvin |
| Electrical resistivity: | >$10^5$ ohm*cm |
| Specific Heat: | 0.66 joule/gram*Kelvin |
| Density: | 3.2 gram/cm$^3$ |

Silicon may also be used, if lightly (not heavily) doped (i.e. $10^{14}$/cm$^3$) and has the following properties:

| | |
|---|---|
| Thermal conductivity: | 80 watt/meter*Kelvin |
| Electrical resistivity: | 20–100 ohm*cm |
| Specific Heat: | 0.7 joule/gram*Kelvin |
| Density: | 2.3 gram/cm$^3$ |

Aluminum nitride or aluminum oxide are other alternatives.

The heat transfer material 75 may be bonded to the heat sink 74 by techniques well known in the art (e.g., using bonding materials such as thermoplastics, epoxies, or other organic or inorganic bonding materials), without the restriction of requiring high electrical resistivity bonding material in the area proximate the heat sink 74. This provides a very low thermal contact resistance between heat transfer material 75 and heat sink 74.

The heat transfer material 75 also serves to separate the inductive antennas 90, 92 and/or 42, 44 from the heat sink 74 which if it is metal, forms a ground plane or reflector to the induction field generated in the vicinity of each inductive antenna 90, 92 and/or 42, 44. If the heat sink 74 is metal and is too close to the inductive antenna 90, 92 and/or 42, 44, then eddy currents are induced in the ground plane, causing power loss. In addition, the RF currents through the antenna 90, 92 and/or 42, 44 become very large to drive a given RF power, increasing I$^2$R losses in the circuit. The antennas 90, 92 and/or 42, 44 are each four turns comprised of ³⁄₁₆" diameter water cooled copper tubing insulated with ¼" outside diameter teflon tubing yielding coils 1" in height. An acceptable distance between the window/electrode 52 and the metal heat sink 74 is about 2", yielding about a 1" distance between the top of the antenna 90, 92 and/or 42, 44 and the heat sink 74.

As described above, thermal contact resistances between the heat transfer material 75 and the window, electrode 52, and between the heat transfer material 75 and the heat sink 74 can be minimized by bonding the materials together. Also described above was an example of forming the window/electrode 52 and the heat transfer material 75 from a single piece of material, eliminating one thermal contact resistance. However, in some cases, one or both thermal contact resistances cannot be avoided. However, the thermal contact resistance(s) can be minimized in accordance with a feature of the present invention, which will now be introduced.

Thermal contact resistance between two parts is comprised of two parallel elements: 1) mechanical point contact between the parts, and 2) conduction through air (or other medium) between the parts. In the absence of air or other medium, the thermal contact resistance between the two parts is very high and typically unacceptable for heating and/or cooling of the window/electrode 52 due to the high heat loads imposed on it during typical plasma reactor operation. The presence of air yields a lower thermal contact resistance than mechanical point contact alone, but is typically marginal depending on the effective gap between parts, which is a function of the surface roughness and flatness of both parts. For air in the high pressure continuum regime wherein the mean-free-path in the gas is small relative to the effective gap between parts, the thermal conductivity of the air is invariant with gas pressure, and the thermal conductance per unit area is simply the ratio of the thermal conductivity of air to the effective gap. For air at atmospheric pressure and 100 degrees C., the thermal conductivity is about 0.03 watt/meter*Kelvin. Heat transfer across the gap is limited by the low chamber pressure and by the fact that the mechanical contact between the two parts is only point contact.

In order to improve heat transfer, a thermally conductive gas such as (preferably) helium or another one of the inert gases such as argon, xenon and so forth, can be placed in the gap between the between the heat transfer material 75 and the heat sink 74 and/or in the gap between the heat transfer material 75 and the window/electrode 52, in accordance with a first embodiment of the present invention. The thermally conductive gas in the gap is best pressurized above the chamber pressure to as high as atmospheric pressure, although preferably the pressure of the thermal transfer gas in the gap is between the chamber pressure and atmospheric pressure. Helium is a preferred choice for the thermally conductive gas because helium has a thermal conductivity of about 0.18 watt/meter*Kelvin at atmospheric pressure and 100 degree C. To minimize thermal contact resistance between the heat transfer material 75 and the heat sink 74, helium can be provided to each interface therebetween through a helium distribution manifold within the heat sink 74, as will be described in detail below in this specification. As will also be described below in detail, an O-ring of small cross-section and low durometer can be used to reduce helium leakage and between heat transfer material 75 and heat sink 74. Through-holes from the top surface of the heat transfer material or rings 75 can connect a helium passage from an upper interface between the heat sink 74 and the heat transfer material ring 75, to interface between the heat transfer material ring 75 and the window/electrode 52. Helium can be supplied to the aforementioned helium distribution manifold located within heat sink 74 at a pressure somewhat above atmospheric to minimize dilution of helium by air which could otherwise increase the thermal contact resistance.

Other materials may be used in between the heat transfer material 75 and the window/electrode 52, and between the heat transfer material 75 and the heat sink 74 to minimize thermal contact resistances. Examples are thermally conductive, compliant elastomeric pads such as boron nitride or silicon carbide or silicon or aluminum nitride or aluminum oxide, and similar materials. Metal-impregnated elastomeric pads may be used at the interface adjacent the heat sink 74, but not adjacent the window/electrode 52 for the same reasons explained above that in general a conductor may not be placed adjacent the window electrode 52. Soft metals such as 1100 series aluminum, indium, copper or nickel may be used at the interface adjacent the heat sink 74, but not adjacent the window/electrode 52 for the reasons explained above.

The cooling capability and heating power requirements are best selected or sized depending on 1) temperature control range required of the window/electrode, 2) the minimum and maximum heat internal loads, 3) the material properties and physical dimensions of the window/electrode, the heat transfer materials, the heat sink plate and the interfaces between heat sink plate, heat transfer materials, and window/electrode, and 4) the temperature of the heat sink. Generally, the cooling capability is sized first for the lowest required temperature of operation of the window/ electrode with the highest internal heat load, and the heating power is then sized to overwhelm the cooling for the highest required temperature of operation of the window/electrode with the lowest internal heat load (typically zero internal heat load).

FIG. 18 corresponds to an enlarged view of a portion of FIG. 5 and illustrates one implementation of the foregoing concept of a thermally conductive gas interface at both faces (top and bottom) of the thermally conductive spacer 75 which is not integrally formed with the semiconductor window electrode 52. In FIG. 18, the overlying cold plate 74 sandwiches plural cylindrical spacer rings 75 with the underlying semiconductor window electrode 52 as illustrated in FIG. 5. Each spacer or torus 75 can be a material different from the semiconductor window electrode 52, as discussed above. A manifold 1000 is formed in the cold plate 74 into which a thermally conductive gas such as helium may be supplied from a source 1010 under positive pressure. Preferably, but not necessarily, the positive pressure of the source 1010 is selected so as to maintain the pressure within the thin gap between the two parts significantly above the reactor chamber pressure but below atmospheric pressure. Gas orifices 1020 connect the manifold 1000 to the top interface 1030 between the cold plate 74 and the spacer 75, permitting the thermally conductive gas (e.g., Helium) to fill the voids in the interface 1030. An axial passage 1040 is provided through the spacer 75 between its top and bottom faces. The axial passage 1040 connects the top interface 1030 with a bottom interface 1050 between the bottom face of the spacer 75 and the underlying semiconductor window electrode 52. The axial passage 1040 permits the thermally conductive gas to flow from the top interface 1030 to the bottom interface 1050 to fill voids in the bottom interface 1050, so that the thermally conductive gas fills voids in both the top and bottom interfaces 1030, 1050. By the source 1010 maintaining the thermally conductive gas manifold 1000 under positive pressure (e.g., 5 psi higher than the chamber pressure), the gas flows to both interfaces 1030, 1050. In order to reduce or prevent leaking of the thermally conductive gas from the interfaces 1030, 1050, small cross-section O-rings 1070, 1080 are sandwiched in the top and bottom interfaces, respectively, at the time of assembly. The O-rings 1070, 1080 define nearly infinitesimally thin gas-containing volumes in the respective interfaces 1030, 1050 in communication with the respective gas manifold 1000, 1040.

FIG. 19 illustrates how the embodiment of FIG. 18 is modified to accommodate an array of conductive torus spacers 75 integrally formed with the semiconductor window electrode 52. In this case, the only interface to be filled by the thermally conductive gas is the top interface 1030.

Figure 20:
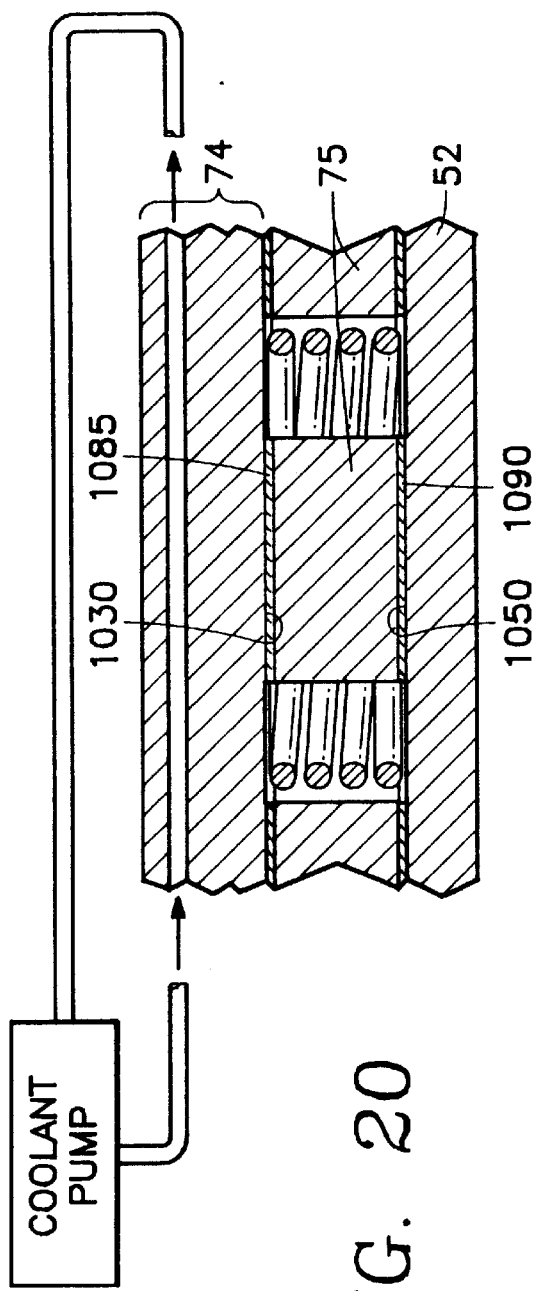
FIG. 20 is a cut-away cross-sectional view illustrating a third embodiment of the present invention having a thermally conductive solid interface material at each face of the thermally conductive torus of FIG. 5.

FIG. 20 corresponds to an enlarged view of a portion of FIG. 5 and illustrates one implementation of the foregoing concept of a thermally conductive solid interface material at both faces (top and bottom) of the thermally conductive spacer 75 which is not integrally formed with the semiconductor window electrode 52. In FIG. 18, the overlying cold plate 74 sandwiches plural cylindrical spacer rings 75 with the underlying semiconductor window electrode 52 as illustrated in FIG. 5. Each spacer or torus 75 can be a material different from the semiconductor window electrode 52, as discussed above. A thermally conductive solid interface material layer 1085, 1090 is placed in either or both the top and bottom interfaces 1030, 1050; respectively. If a solid material layer is placed in only one of the top and bottom interfaces 1030, 1050, then the remaining interface may be filled with a thermally conductive gas in the manner of FIG. 18. However, FIG. 20 illustrates the case in which a thermally conductive solid interface material layer is in both interfaces 1030, 1050. As discussed above, the solid interface material layer 1085 in the top interface 1030 may be a soft metal, but the solid interface material layer 1090 in the bottom interface 1050 cannot be highly electrically conductive because it is next to the electrode 52. The top layer 1085 may be soft aluminum, indium, copper or nickel or an elastomer impregnated with powders or particles of such metals. Either one of the top and bottom layers 1085, 1090 may be an elastomer impregnated with powder or particles of a thermally conductive electrically insulating material such as boron nitride, high electrical resistivity (e.g., bulk) silicon carbide or silicon, aluminum nitride, aluminum oxide and like materials. Alternatively, either one or both of the material layers 1085, 1090 may be a bonding material, such as thermoplastic, epoxy or an organic or inorganic bonding material.

Figure 21:
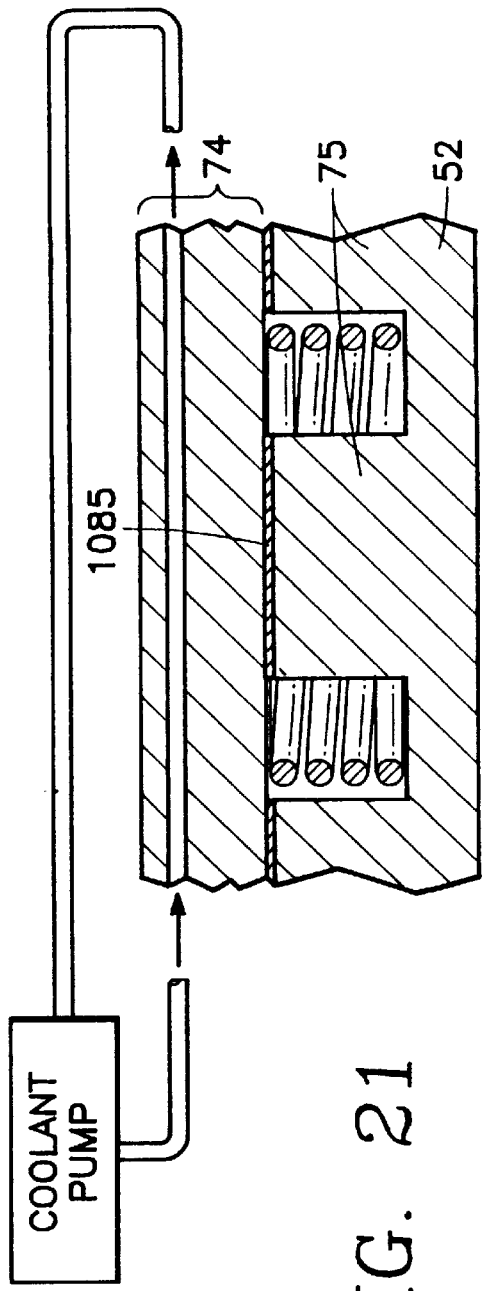
FIG. 21 is a cut-away cross-sectional view illustrating a fourth embodiment of the present invention having a thermally conductive solid interface material at the one face of a thermally conductive torus integrally formed with the semiconductor window electrode.

FIG. 21 illustrates how the embodiment of FIG. 20 is modified to accommodate an array of conductive torus spacers 75 integrally formed with the semiconductor window electrode 52. In this case, the only interface to be filled is the top interface 1030.

The invention also solves a severe cooling problem with heated parts inside the reactor chamber which are difficult to cool, such as the heated disposable ring 62 of polymer-hardening precursor material described above with reference to FIG. 5. (The ring 62 may be heated only by plasma heating if no heater is provided, and still require cooling.) It also solves a problem of heating parts inside the reactor chamber which are difficult to heat directly.

Figure 23:
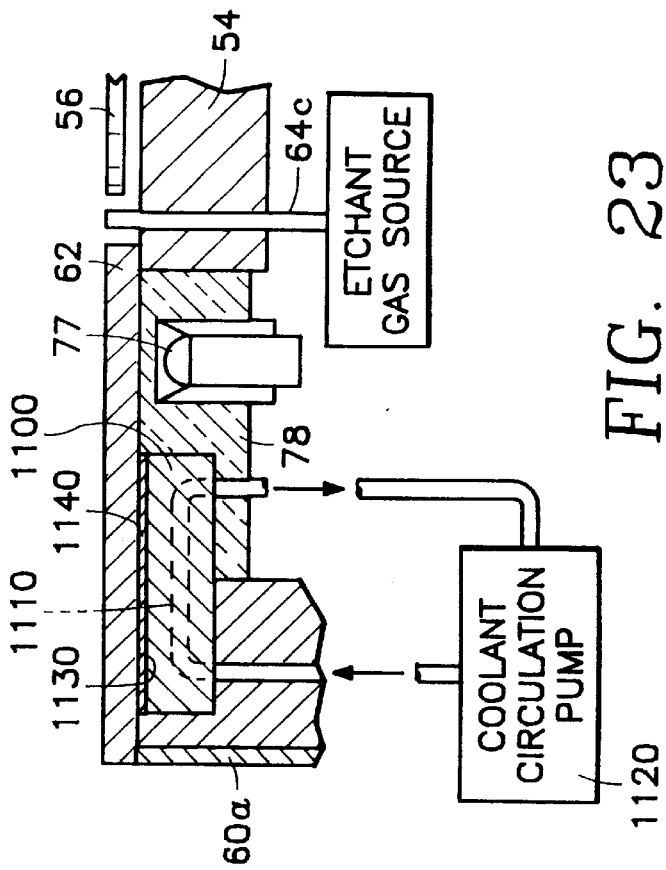
FIG. 23 is a cut-away cross-sectional view illustrating a sixth embodiment of the present invention in which the disposable silicon-containing ring of FIG. 5 is cooled by a cold plate with a thermally conductive solid interface material between the cold plate and the disposable silicon ring.
Figure 22:
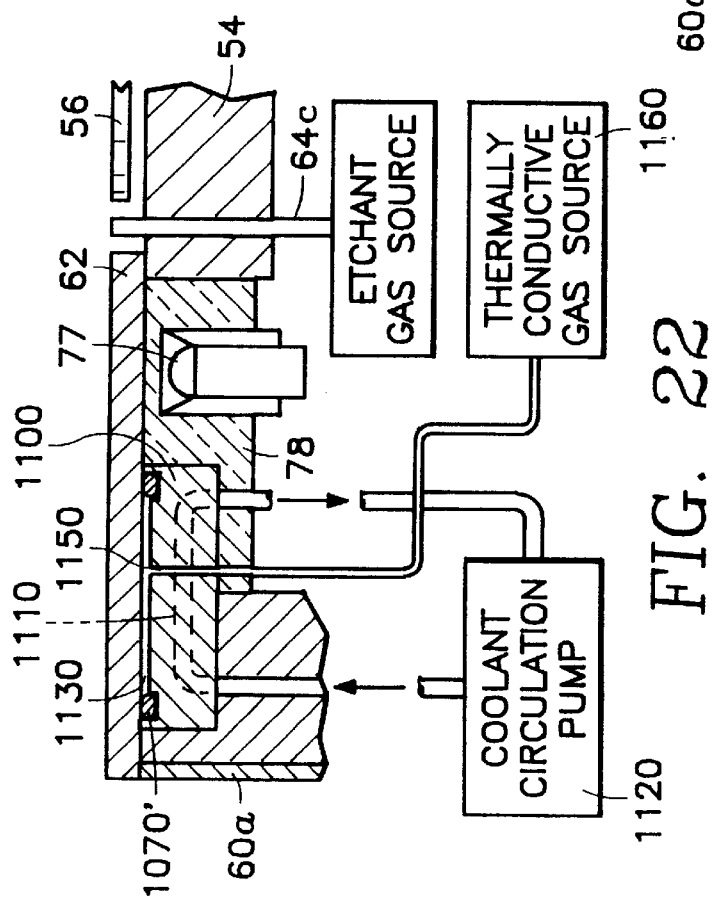
FIG. 22 is a cut-away cross-sectional view illustrating a fifth embodiment of the present invention in which the disposable silicon-containing ring of FIG. 5 is cooled by a cold plate with a thermally conductive gas interface between the cold plate and the disposable silicon ring.

Referring to FIGS. 22 and 23, a cold plate 1100 directly beneath the ring 62 and in thermal contact has internal coolant jackets 1110 which receive coolant from a coolant circulation pump 1120. The interface 1130 between the cold plate 1110 and the ring 62 is filled with a thermal conductivity enhancing substance such as a thermally conductive gas (as in FIG. 22) or a thermally conductive solid material layer 1140 (as in FIG. 23). The thermally conductive gas may be any gas capable of conducting heat, such as an inert gas or even a gas similar to the process gas employed in the reactor chamber, although an inert gas such as helium is preferred. In the case of the embodiment of FIG. 22 employing the thermally conductive gas, a manifold 1150 through the cold plate 1100 is connected to a thermally conductive gas source 1160 which supplies thermally conductive gas through the manifold 1160 into the interface 1130. Leakage of the gas from the interface 1130 is preferably controlled to reduce or prevent loss by sandwiching an elastomeric low-cross-section O-ring 1070' between the cold plate 1100 and silicon ring 62 at the time the ring is put into its place.

While helium is preferred as the thermally conductive gas in the gap, in the case of application to heated or cooled parts inside the sub-atmospheric reactor chamber, any gas, including a processing gas, could suffice at a pressure greater than the chamber pressure but below atmospheric. In such a case, the gas may be allowed to leak into the chamber so that the use of a peripheral seal such as an O-ring or elastomer may not be necessary. Since the thermally conductive gas (or "thermal transfer gas") is pressurized above the chamber pressure, some clamping force must be applied. Such a clamping force can be mechanical or may be electrostatically induced between the plate 1100 and the ring 62. Such an electrostatic clamping feature would require a material which is at least partially electrically insulating to be placed between the plate 1100 and the ring 62. Such a feature can eliminate the need for a peripheral seal to control leakage of the thermally conductive gas. Such an electrostatic clamping feature is described below in this specification with reference to FIG. 26.

The thermally conductive gas can be derived from any suitable source. For example, if the wafer pedestal employs helium cooling underneath the wafer, then a common helium source may be employed for cooling the wafer as well as other items (such as the ring 62) inside the chamber.

In the embodiment of FIG. 23, the layer of solid thermally conductive material 1140 may be soft aluminum, indium, copper or nickel or an elastomer impregnated with powders or particles of such metals or it may be an elastomer impregnated with powder or particles of a thermally conductive electrically insulating material such as boron nitride, high resistivity (e.g., bulk) silicon carbide or silicon, aluminum nitride, aluminum oxide and like materials.

Figure 24:
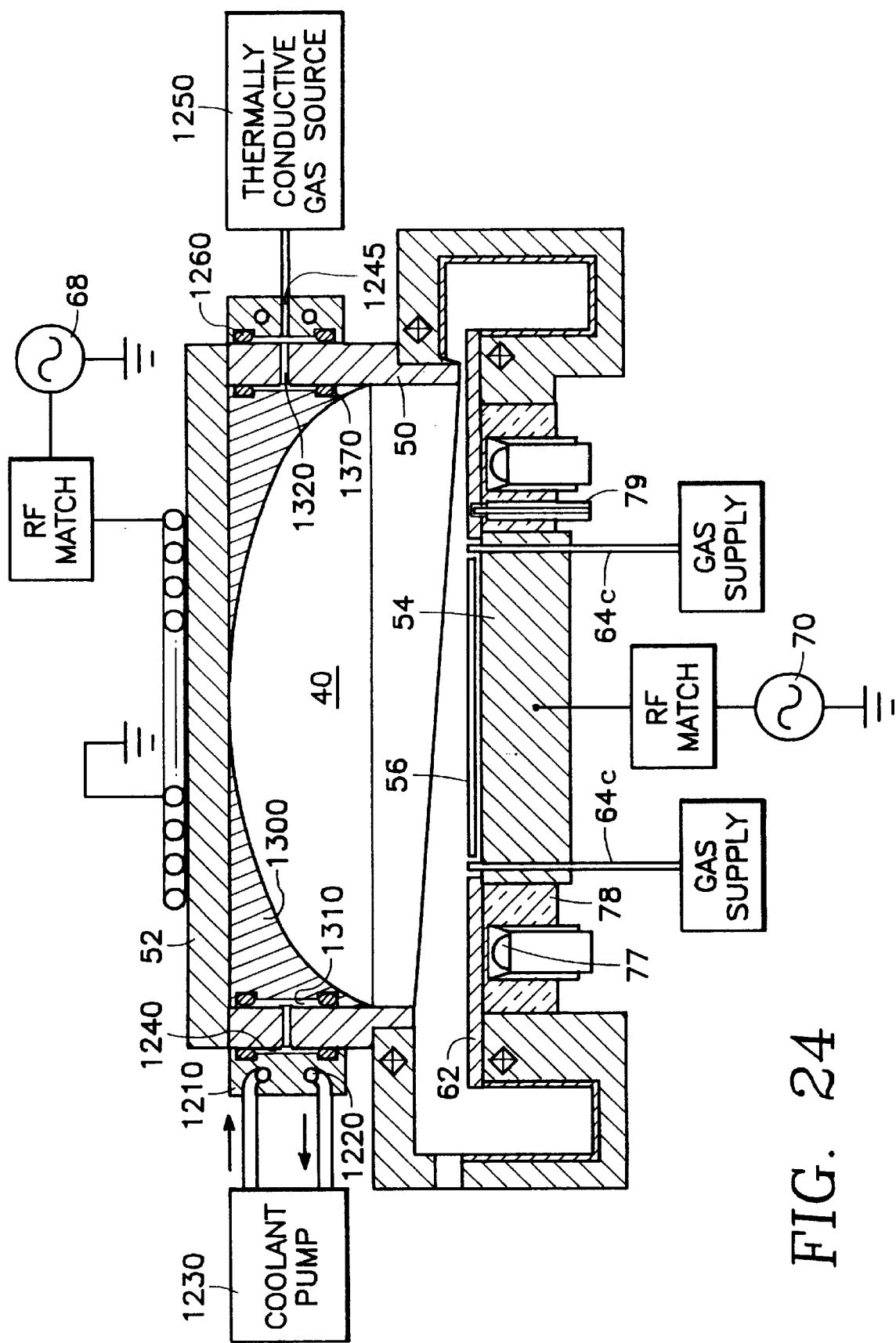
FIG. 24 illustrates a seventh embodiment of the present invention in which the chamber wall and an interior chamber liner are cooled using a thermally conductive gas in the interfaces across the heat conduction paths.

The present invention also concerns cooling chamber walls and chamber liners in a similar manner. Referring to FIG. 24, the chamber side wall 50 in any of the reactors discussed above may be cooled by an exterior cold plate 1210 adjacent a portion of the exterior of the wall 50. The cold plate includes internal coolant jackets 1220 through which coolant is recirculated by a coolant pump 1230. The interface 1240 between the cold plate 1210 and the side wall 50 is filled with a thermally conductive gas (such as helium) fed through a manifold 1245 through the cold plate 1210 into the interface 1240 from a gas source 1250 which maintains the gas at a positive pressure. Leakage of the thermally conductive gas from the interface 1240 is reduced or prevented by an O-ring 1260 sandwiched between the cold plate 1210 and the side wall 50 at the time of assembly. The O-ring 1260 defines a gas-containing volume of the interface 1240 which is nearly infinitesimally thin and in communication with the manifold 1245.

An interior chamber liner 1300 may be cooled by heat conduction to a cooled body, such as the side wall 50. In accordance with the present invention, such cooling is enhanced by filling the interface 1310 between the liner 1300 and the interior surface of the side wall 50 with a thermally conductive gas such as helium. For this purpose, a radial narrow gas channel 1320 is provided through the side wall 50 to provide gas flow between the interface 1240 on the external side wall surface and the interface 1310 on the internal side wall surface. The thermally conductive gas supplied through the manifold 1245 fills the external surface interface 1240 and, through the channel 1320, fills the internal surface interface 1310 between the liner 1300 and the side wall 50. To prevent or reduce gas leakage, an O-ring 1370 is sandwiched between the side wall 50 and the liner 1300 at the time of assembly. The O-ring 1370 defines a nearly infinitesimally thin gas-containing volume within the interface 1310 in communication with the gas channel 1245 in the side wall 50.

Figure 25:
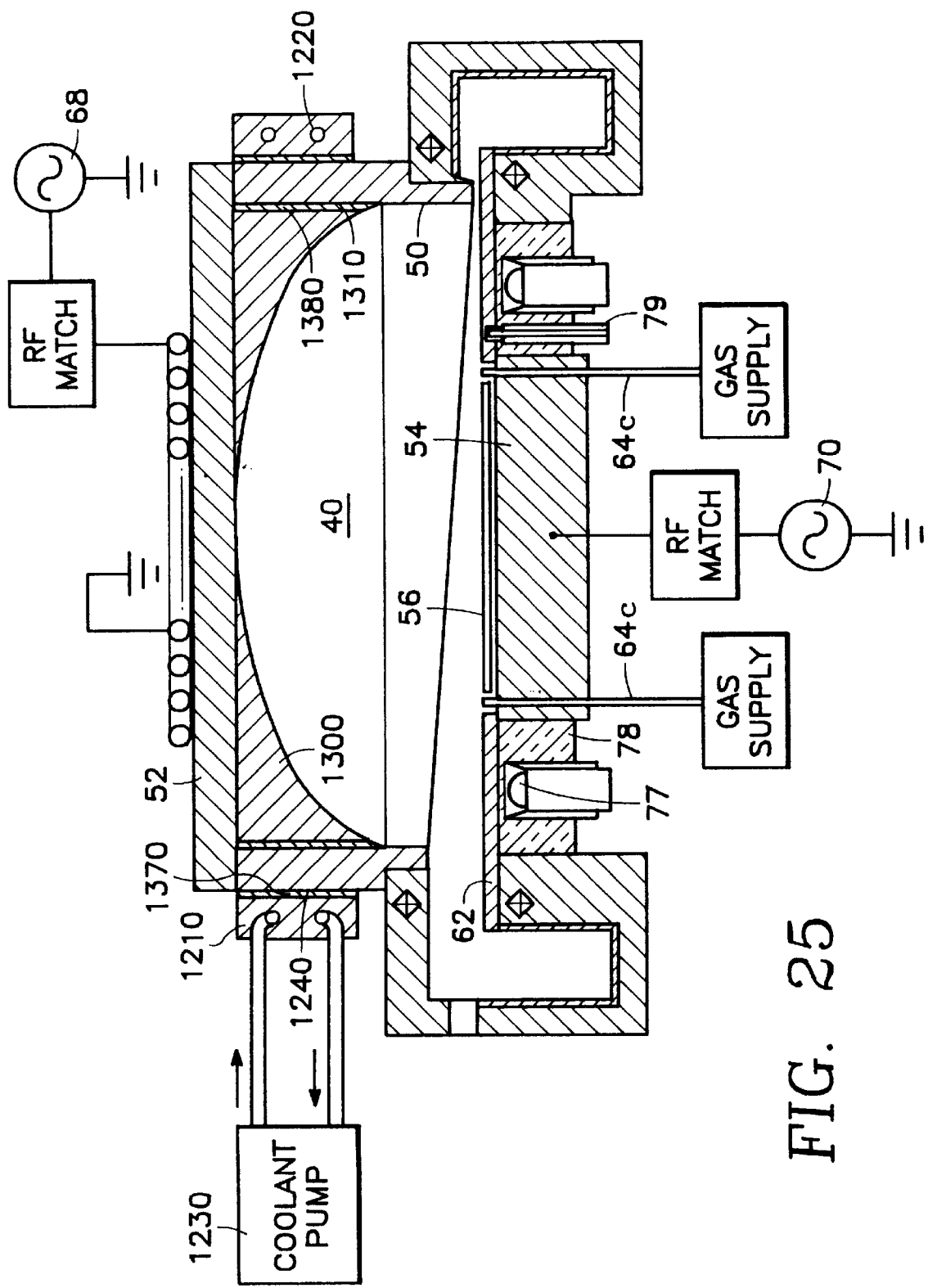
FIG. 25 illustrates a modification of the embodiment of FIG. 24 in which the interfaces are each filled with a solid thermally conductive layer instead of the thermally conductive gas.

FIG. 25 illustrates how the embodiment of FIG. 24 is modified by substituting a solid material layer 1370, 1380 in each of the interfaces 1240 and 1310, respectively, instead of the thermally conductive gas. In the embodiment of FIG. 25, each layer 1370, 1380 of solid thermally conductive material may be soft aluminum, indium, copper or nickel or an elastomer impregnated with powders or particles of such metals or it may be an elastomer impregnated with powder or particles of a thermally conductive electrically insulating material such as boron nitride, high resistivity (e.g., bulk) silicon carbide or silicon, aluminum nitride, aluminum oxide and like materials.

Figure 26:
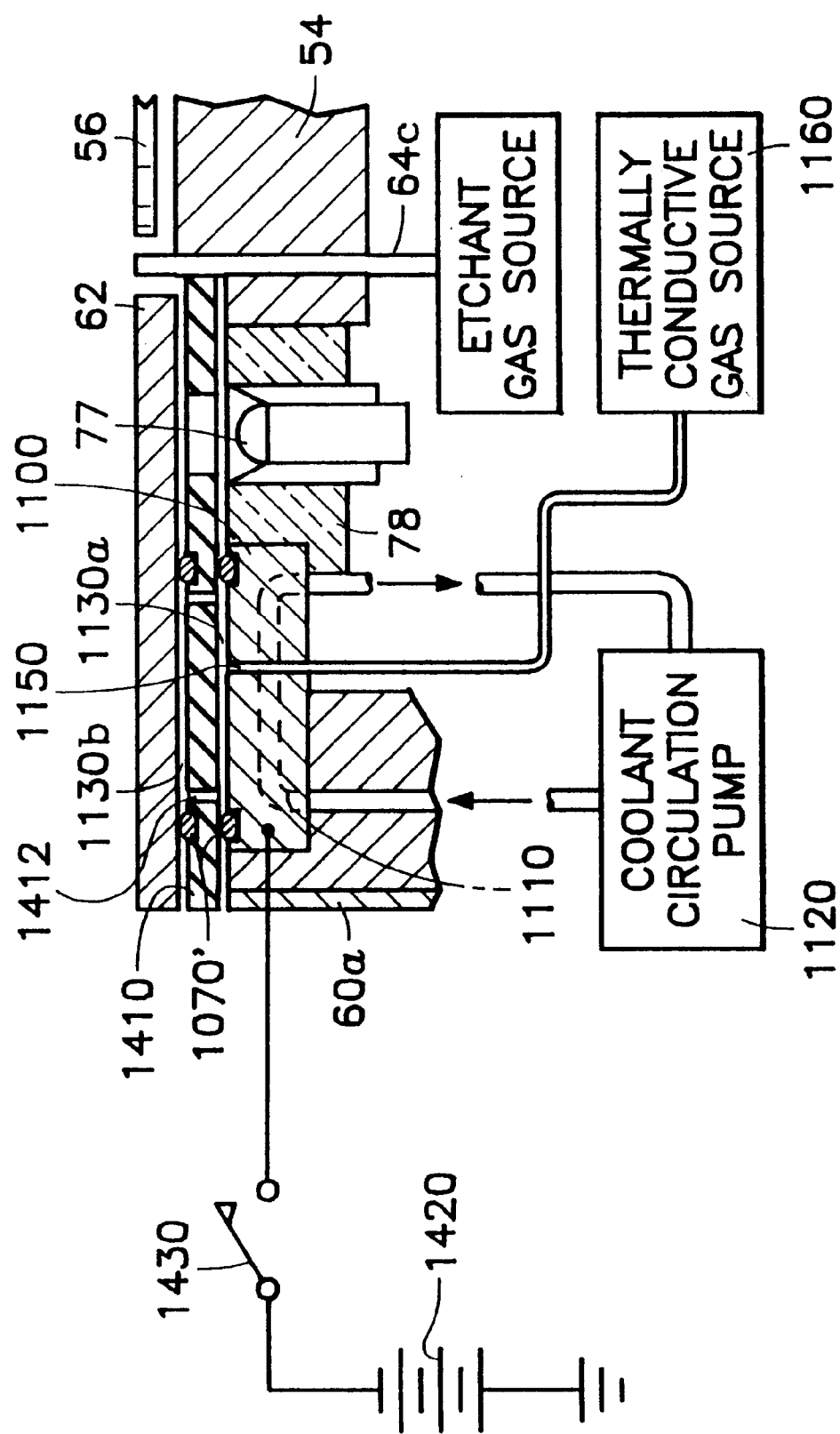
FIG. 26 illustrates the embodiment of FIG. 22 in which the ring is electrostatically clamped to seal the thermally conductive gas.

FIG. 26 illustrates how the embodiment of FIG. 22 may be modified to include the feature of electrostatic clamping of the ring 62 to the cold plate 1100. In FIG. 26, a dielectric layer 1410 is inserted between the polymer-hardening precursor ring 62 and the cold plate 1100, and an electrostatic clamping voltage is applied to the cold plate 1100 from a D.C. voltage source 1420 through a clamping switch 1430. Introduction of the insulating or dielectric layer 1410 creates a gap 1130a between the cold plate 1100 and the insulating layer 1410 and a gap 1130b between the ring 62 and the insulating layer 1410. The insulating layer 1410 has passageways 1412 therethrough so that gas supplied from the passageway 1150 into the gap 1130a can flow into the other gap 1130b. While FIG. 26 shows O-rings 1070' sealing both gaps 1130a and 1130b, such O-rings may not be necessary, depending upon the electrostatic clamping force induced.

The present invention provides a great improvement (by a factor of about 6 in the case of the introduction of helium) in thermal conductivity across the interface between heat-receiving elements of the reactor either inside the chamber (such as chamber liners, disposable silicon rings) and outside the chamber (such as window electrodes, side walls) and a cooling plate or cold sink. As a result, the automated control of temperature of many critical parts of the plasma reactor is improved to a new capability exceeding that of the prior art. The invention accomplishes this in one or a combination of two characteristic modes at the various interfaces: (a) the introduction of a thermally conductive gas into the interface and (b) the introduction of a thermally conductive solid layer in the interface. This, in combination with efficiently controlled heating of the same elements, permits accurate feedback control of the temperature of each such element thus heated and cooled.

In selecting the heat transfer materials and/or physical dimensions of the reactor, the cooling conductance required (G) is determined as follows:

G=total maximum internal heat load (watts)/Delta-T1 (degree C.)

where Delta-T1=Difference between heat sink temperature and minimum window/electrode temperature.

Alternatively, if the heat transfer materials and physical dimensions have already been chosen, then the required heat sink temperature may be trivially calculated by rearranging the above equation for Delta-T1 as function of G.

Heating power is then determined as follows:

P=total external heating power required (watts) delivered to control surface,

P=(G*Delta-T2)−Pmin where:

G is the cooling conductance from above (in watts/degree C.),

Delta-T2=Difference between heat sink temperature and maximum window/electrode temperature Pmin is the minimum internal heat load on the window/electrode.

EXAMPLE 1

The window/electrode 52 and the heat transfer rings 75 are integrally formed as a monolithic piece, and the window/electrode 52 is a flat circular disk 12.81 inches in diameter and 0.85 in thick. Formed integrally with the window/electrode 52 is an array of four concentric cylindrical heat transfer rings (75) 2" high of the following inside and outside diameters:

1. outer heat transfer ring—12.80" outside dia., 10.79" inside dia.,
2. middle heat transfer ring—9.010" outside dia., 7.595" inside dia., 3. inner heat transfer ring—5.715" outside dia., 3.940" inside dia.,
4. center heat transfer ring—2.260" outside dia., 0.940" inside dia.

The window/electrode 52 and integral array of concentric cylindrical heat transfer rings 75 are fabricated together from a single ingot of polycrystalline silicon with the following thermal and electrical properties:

| | |
|---|---|
| Doping level: | $10^{14}/cm^3$, boron or phosphorous |
| Thermal conductivity: | 80 watt/meter*Kelvin |
| Electrical resistivity: | from 20 to 100 ohm*cm |
| Specific Heat: | 0.7 joule/gram*Kelvin |
| Density: | 2.3 gram/cm$^3$ |

A plurality of 750 watt @120 volt rms tungsten filament lamps 76 are employed. The number of lamps is selected based on measured 73% efficiency (output power/ac input power) and on 400 watt @80 volt rms maximum operating level (for long lamp life). Two heat zones are employed, those on the outer circle comprise one zone (outer), and those on the inner circle and at the center comprise the second (inner) zone. Each zone has its own temperature measurement (a type-K thermocouple spring loaded against the window/electrode surface) and its own output transducer (a phase-angle controller). The lamps, manufactured by Sylvania, are deployed as follows:

15 lamps on a 13.55" diameter circle, equal angular spacing (24 degrees);
15 lamps on a 6.655" diameter circle, equal angular spacing (24 degrees);
1 lamp on central axis.

The outer lamp circle is surrounded on the outside by a cylindrical polished aluminum reflector that is integral with the heat sink 74.

The outer solenoid antenna 90 is 4 turns comprised of ³⁄₁₆" diameter water cooled copper tubing insulated with ¼" outside diameter teflon tubing yielding coil 1" in height and 10" mean diameter, wound as described in the above-referenced parent application.

The inner solenoid antenna 42 is 4 turns comprised of ³⁄₁₆" diameter water cooled copper tubing insulated with ¼" outside diameter teflon tubing yielding coil 1" in height and 3.25 mean diameter, wound as described in the above-referenced parent application.

The heat sink plate 74 is a water cooled aluminum plate maintained at 75 degree C. by a closed loop heat exchanger using a 50/50% water/ethylene-glycol mixture at a flow rate of 2 gallons per minute. The heat sink 74 houses lamp sockets and provides cooling for the lamps 76 required due to inherent lamp losses to socket (approximately 27%). The heat sink plate 74 includes feed-through for the inner and outer solenoidal antennas 42, 90. The heat sink 74 also functions as a ground plane for the antennas 42, 90. The heat sink plate 74 includes O-ring grooves to accommodate 0.139 inch diameter, 30 durometer soft O-rings deployed just inside the outer diameter of each heat transfer ring 75 and just outside the inner diameter of each heat transfer ring 75. The heat sink 74 is mounted on top of the integral array of concentric cylindrical heat transfer rings 75. Surface roughness of both surfaces (the bottom of the heat sink 74 and the top of heat transfer rings 75) is less than a micro-inch. Flatness of each surfaces is less than 0.0005 inch. The effective gap between the bottom of the heat sink and the top of the heat transfer rings is less than 0.001 inch.

EXAMPLE 2

The window/electrode 52 and the heat transfer rings 75 are separate pieces formed of different materials. The window/electrode 52 is a flat circular disk 14.52 inches in diameter and 0.85 inches thick. A separate array of 4 concentric cylindrical heat transfer rings 75 2" high of the following inside and outside diameters is placed in between the heat sink plate and the window electrode:

1. outer heat transfer ring—12.70" outside dia., 10.67" inside dia.,
2. middle heat transfer ring—8.883" outside dia., 7.676" inside dia.,
3. inner heat transfer ring—5.576" outside dia., 3.920" inside dia.,
4. center heat transfer ring—2.080" outside dia., 1.050" inside dia.

The window/electrode 52 is fabricated from a single ingot of polycrystalline silicon with the following thermal and electrical properties:

| | |
|---|---|
| Doping level: | $10^{14}/cm^3$, boron or phosphorous |
| Thermal conductivity: | 80 watt/meter*Kelvin |
| Electrical resistivity: | 20–100 ohm*cm |
| Specific Heat: | 0.7 joule/gram*Kelvin |
| Density: | 2.3 gram/cm$^3$ |

The array of concentric cylindrical heat transfer rings 75 are fabricated from SiC (silicon carbide) with the following thermal and electrical properties:

| | |
|---|---|
| Thermal conductivity: | 130 watt/meter*Kelvin |
| Electrical resistivity: | $10^5$ ohm*cm |
| Specific Heat: | 0.655 joule/gram*Kelvin |
| Density: | 3.2 gram/cm$^3$ |

A plurality of 750 watt @120 volt rms tungsten filament lamps are employed. The number of lamps is selected based on measured 73% efficiency (output power/ac input power) and 400 watt @80 volt rms maximum operating level (for long lamp life). Two heat zones are employed, those on the outer circle comprise one zone (outer), and those on the inner circle and at the center comprise the second (inner) zone. Each zone has its own temperature measurement (a type-K thermocouple spring loaded against the window/electrode surface) and its own output transducer (a phase-angle controller). The lamps 76, manufactured by Sylvania, are deployed as follows:

15 lamps on 13.551" diameter circle, equal angular spacing (24 degree);
15 lamps on 6.626" diameter circle, equal angular spacing (24 degree);
1 lamp on central axis.

The outer lamp circle is surrounded on the outside by a cylindrical polished aluminum reflector that is integral with the heat sink.

The outer solenoid antenna 90 is four turns comprised of ³⁄₁₆" diameter water cooled copper tubing insulated with ¼" outside diameter teflon tubing yielding coil 1" in height and 10" mean diameter, wound as described in the above-referenced parent application.

The inner solenoid antenna 42 is four turns comprised of ³⁄₁₆" diameter water cooled copper tubing insulated with ¼" outside diameter teflon tubing yielding coil 1" in height and 3.25 mean diameter, wound as described in the above-reference parent application.

The heat sink plate 74 is a water cooled aluminum plate maintained at 75 degrees C. by a closed loop heat exchanger using a 50/50% water/ethylene-glycol mixture at a flow rate of 2 gallons per minute. Heat sink houses lamp sockets and provides cooling for the lamps, required due to inherent lamp losses to socket (approximately 27%). The heat sink plate 74 includes feed-through for the aforementioned inner and outer solenoidal antennas 42, 90. The heat sink 74 also functions as a ground plane for the antennas. The heat sink plate 74 and the window/electrode 52 include O-ring grooves to accommodate 0.139 inch diameter, 30 durometer soft O-rings deployed just inside the outer diameter of each heat transfer ring 75 and just outside the inner diameter of each heat transfer ring 75. The heat sink 74 is mounted on top of the array of concentric cylindrical heat transfer rings 75. Surface roughness of all surfaces (bottom of the heat sink and top of the heat transfer rings, bottom of the heat transfer rings and top of the window/electrode) is less than a micro-inch. Flatness of each surface is less than 0.0005 inch. The effective gap between the bottom of the heat sink and the top of the heat transfer rings is less than 0.001 inch. The effective gap between the bottom of the heat transfer rings and the top of the window/electrode is less than 0.001 inch.

While the invention has been described in detail by specific reference to preferred embodiments, it is understood that variations and modifications thereof may be made without departing from the true spirit and scope of the invention.

What is claimed is:

1. A plasma reactor comprising:
    a plasma reactor chamber and a workpiece support for holding a workpiece in a support plane inside said chamber during processing, said chamber having a reactor enclosure portion facing said support;
    a cold sink adjacent said reactor enclosure portion;
    a plasma source power applicator between said reactor enclosure portion and said cold sink; and
    a thermal conductor between and in contact with said cold sink and said reactor enclosure said thermal conductor and said cold sink define a cold sink interface therebetween;
    a thermally conductive substance within said cold sink interface for reducing the thermal resistance across said cold sink interface, said thermally conductive substance comprising a thermally conductive gas filling said cold sink interface;
    a gas manifold in said cold sink communicable with a source of said thermally conductive gas;
    an inlet through said cold sink from said gas manifold and opening out to said cold body interface;
    an O-ring apparatus sandwiched between said cold sink and said thermal conductor and defining a gas-containing volume in said cold sink interface in communication with said inlet from said cold sink, said gas-containing volume is of nearly infinitesimal thickness.

2. A plasma reactor comprising:
    a plasma reactor chamber and a workpiece support for holding a workpiece in a support plane inside said chamber during processing, said chamber having a reactor enclosure portion facing said support;
    a cold sink adjacent said reactor enclosure portion;
    a plasma source power applicator between said reactor enclosure portion and said cold sink; and
    a thermal conductor between and in contact with said cold sink and said reactor enclosure said thermal conductor and said cold sink define a cold sink interface therebetween;
    a thermally conductive substance within said cold sink interface for reducing the thermal resistance across said cold sink interface, said thermally conductive substance comprising a thermally conductive gas filling said cold sink interface;
    a gas manifold in said cold body communicable with a source of said thermally conductive gas;
    an inlet through said cold body from said gas manifold and opening out to said cold body interface;
    an O-ring apparatus sandwiched between said cold sink and said thermal conductor and defining a gas-containing volume in said cold sink interface in communication with said inlet from said cold sink;
    a reactor enclosure interface being defined between said reactor enclosure portion and said thermal conductor, said thermally conductive gas filling said reactor enclosure interface for reducing the thermal resistance across said reactor enclosure interface wherein said thermal conductor is formed separately from said reactor enclosure portion whereby a reactor enclosure interface is defined between said reactor enclosure portion and said thermal conductor, said reactor further comprising:
        a thermally conductive gas filling said reactor enclosure interface for reducing the thermal resistance across said reactor enclosure interface.

3. The reactor of claim 2 further comprising a gas channel through said thermal conductor and communicating between said cold sink interface and said reactor enclosure interface.

4. The reactor of claim 3 further comprising an O-ring apparatus between said reactor enclosure portion and said thermal conductor defining a gas-containing volume in said reactor enclosure interface in communication with said gas channel of said thermal conductor.

5. A plasma reactor comprising:
    a plasma reactor chamber and a workpiece support for holding a workpiece in a support plane inside said chamber during processing, said chamber having a reactor enclosure portion facing said support;
    a cold sink adjacent said reactor enclosure portion;
    a plasma source power applicator between said reactor enclosure portion and said cold sink; and
    a thermal conductor between and in contact with said cold sink and said reactor enclosure said thermal conductor and said cold sink define a cold sink interface therebetween;
    a thermally conductive substance within said cold sink interface for reducing the thermal resistance across said cold sink interface,
    a reactor enclosure interface defined between said reactor enclosure portion and said thermal conductor;
    a thermally conductive substance within said reactor enclosure interface for reducing the thermal resistance across said reactor enclosure interface, said thermally conductive substance comprising a thermally conductive solid material, said thermally conductive solid material comprising an elastomer impregnated with particles of a thermally conductive material, said particles of a thermally conductive material have a sufficient electrical resistivity to reduce interference with said power applicator and are thermally conductive.

6. The reactor of claim 5 wherein said particles comprise one of boron nitride, high resistivity silicon carbide, high resistivity silicon, aluminum nitride, and aluminum oxide.

7. A plasma reactor comprising:
- a plasma reactor chamber and a workpiece support for holding a workpiece in a support plane inside said chamber during processing, and a scavenger precursor donor piece inside said chamber near said support;
- a cold sink adjacent said donor piece defining a cold sink interface between said cold sink and said donor piece; and
- a thermally conductive substance within said cold sink interface for reducing the thermal resistance across said cold sink interface.

8. The reactor of claim 7 wherein said thermally conductive substance comprises a thermally conductive gas filling said cold sink interface.

9. The reactor of claim 7 wherein said thermally conductive substance comprises a thermally conductive solid material.

10. The reactor of claim 8 further comprising:
- a gas manifold in said cold body communicable with a source of said thermally conductive gas;
- an inlet through said cold sink from said gas manifold and opening out to said cold sink interface.

11. The reactor of claim 10 further comprising an O-ring apparatus sandwiched between said cold sink and said donor piece and defining a gas-containing volume in said cold sink interface in communication with said inlet from said cold sink.

12. The reactor of claim 9 wherein said thermally conductive solid material comprises a soft metal of the type comprising one of aluminum, indium, copper, nickel.

13. The reactor of claim 9 wherein said thermally conductive solid material comprises an elastomer impregnated with particles of a thermally conductive material.

14. The reactor of claim 13 wherein said particles comprises a soft metal.

15. The reactor of claim 14 wherein said particles of a thermally conductive material comprise one of aluminum, indium, copper, nickel.

16. The reactor of claim 13 wherein said particles of a thermally conductive material have a high electrical resistivity and high thermal conductivity.

17. The reactor of claim 16 wherein said particles comprises one of boron nitride, high resistivity silicon carbide, high resistivity silicon, aluminum nitride, aluminum oxide.

18. A plasma reactor comprising:
- a plasma reactor chamber and a workpiece support for holding a workpiece in a support plane inside said chamber during processing, said chamber including a chamber side wall around said support;
- a cold sink adjacent said side wall defining a cold sink interface between said cold sink and said side wall;
- a thermally conductive substance within said cold sink interface for reducing the thermal resistance across said cold sink interface; and
- wherein said thermally conductive substance comprises a thermally conductive gas filling said cold sink interface.

19. The reactor of claim 18 further comprising:
- a gas manifold in said cold sink communicable with a source of said thermally conductive gas;
- an inlet through said cold sink from said gas manifold and opening out to said cold sink interface.

20. The reactor of claim 19 further comprising an O-ring apparatus sandwiched between said cold sink and said side wall and defining a gas-containing volume in said cold sink interface in communication with said inlet from said cold sink.

21. A plasma reactor comprising:
- a plasma reactor chamber and a workpiece support for holding a workpiece in a support plane inside said chamber during processing, said chamber including a chamber side wall around said support;
- a cold sink adjacent said side wall defining a cold sink interface between said cold sink and said side wall;
- a thermally conductive substance within said cold sink interface for reducing the thermal resistance across said cold sink interface;
- and wherein said thermally conductive substance comprises a thermally conductive solid material and wherein said thermally conductive solid material comprises an elastomer impregnated with particles of a thermally conductive material.

22. The reactor of claim 21 wherein said particles comprises a metal.

23. The reactor of claim 22 wherein said particles of a thermally conductive material comprise one of aluminum, indium, copper, nickel.

24. The reactor of claim 23 wherein said particles comprises one of boron nitride, silicon carbide, silicon, aluminum nitride, aluminum oxide.

25. The reactor of claim 18 further comprising:
- a chamber liner in the interior of said chamber and adjacent said side wall and defining a liner interface between said chamber liner and said side wall; and
- a thermally conductive substance in said liner interface for reducing resistance to thermal conduction across said liner interface.

26. The reactor of claim 25 wherein said thermally conductive substance in said liner interface comprises a thermally conductive gas filling said liner interface.

27. The reactor of claim 25 wherein said thermally conductive substance in said liner interface comprises a thermally conductive solid material.

28. The reactor of claim 26 further comprising:
- a gas channel through said side wall communicating between said cold body interface and said liner interface.

29. The reactor of claim 28 further comprising an O-ring apparatus sandwiched between said side wall and said liner and defining a gas-containing volume in said liner interface in communication with said channel through said side wall.

30. A plasma reactor comprising:
- a plasma reactor chamber and a workpiece support for holding a workpiece in a support plane inside said chamber during processing, said chamber comprising a ceiling facing said support;
- a cold body overlying said ceiling;
- a plasma source power applicator between said cold body and said ceiling and facing through said ceiling a volume of said chamber overlying said support, said plasma source power applicator comprising plural applicator elements radially distributed relative to an axis of said chamber and defining voids between adjacent ones of said applicator elements; and
- a thermally conductive spacer comprising thermally conductive spacer elements in said voids in thermal contact with said ceiling and said cold body.

31. The reactor of claim 30 wherein:

said power applicator comprises an inductive antenna comprising plural inductive elements, said antenna being driven by RF power; and said ceiling provides a window for inductive coupling of RF power.

32. The reactor of claim 31 wherein said ceiling comprises a semiconductor window electrode.

33. The reactor of claim 32 wherein said plural applicator elements comprise plural solenoid winding at respective radial locations connected to respective RF power sources.

34. The reactor of claim 33 wherein said spacer elements comprises cylindrical rings at respective radial locations.

35. The reactor of claim 33 wherein said thermally conductive spacer and said cold body define a cold body interface therebetween, said reactor further comprising:

a thermally conductive substance within said cold body interface for reducing the thermal resistance across said cold body interface.

36. The reactor of claim 35 wherein said thermally conductive substance comprises a thermally conductive gas filling said cold body interface.

37. The reactor of claim 35 wherein said thermally conductive substance comprises a thermally conductive solid material.

38. The reactor of claim 36 further comprising:

a gas manifold in said cold body communicable with a source of said thermally conductive gas;

an inlet through said cold body from said gas manifold and opening out to said cold body interface.

39. The reactor of claim 38 further comprising an O-ring apparatus sandwiched between said cold body and said thermally conductive spacer and defining a gas-containing volume in said cold body interface in communication with said inlet from said cold body.

40. The reactor of claim 39 wherein said thermally conductive spacer is integrally formed with said reactor enclosure portion.

41. The reactor of claim 39 wherein said thermally conductive spacer is formed separately from said reactor enclosure portion whereby a reactor enclosure interface is defined between said reactor enclosure portion and said thermally conductive spacer, said reactor further comprising:

a thermally conductive substance within said reactor enclosure interface for reducing the thermal resistance across said reactor enclosure interface.

42. The reactor of claim 41 wherein said thermally conductive substance in said reactor enclosure interface comprises a thermally conductive gas filling said reactor enclosure interface.

43. The reactor of claim 41 wherein said thermally conductive substance in said reactor enclosure interface comprises a thermally conductive solid material.

44. The reactor of claim 43 wherein said thermally conductive solid material comprises one of aluminum, indium, copper, nickel.

45. The reactor of claim 43 wherein said thermally conductive solid material comprises an elastomer impregnated with particles of a thermally conductive material.

46. The reactor of claim 45 wherein said particles comprises a metal.

47. The reactor of claim 46 wherein said particles of a thermally conductive material comprise one of aluminum, indium, copper, nickel.

48. The reactor of claim 46 wherein said particles comprises one of boron nitride, silicon carbide, silicon, aluminum nitride, aluminum oxide.

49. The reactor of claim 30 further comprising a bonding material layer between said cold body and said thermally conductive spacer.

50. The reactor of claim 30 further comprising a bonding material layer between said thermally conductive spacer and said plasma source power applicator.

* * * * *